(12) United States Patent
Cui et al.

(10) Patent No.: US 11,908,661 B2
(45) Date of Patent: *Feb. 20, 2024

(54) APPARATUS AND METHODS FOR MANIPULATING POWER AT AN EDGE RING IN PLASMA PROCESS DEVICE

(71) Applicant: Applied Materials, Inc., Santa Clara, CA (US)

(72) Inventors: Linying Cui, Cupertino, CA (US); James Rogers, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/843,654

(22) Filed: Jun. 17, 2022

(65) Prior Publication Data

US 2022/0319811 A1 Oct. 6, 2022

Related U.S. Application Data

(60) Continuation of application No. 16/994,190, filed on Aug. 14, 2020, now Pat. No. 11,367,593, which is a division of application No. 16/030,356, filed on Jul. 9, 2018, now Pat. No. 10,763,081.

(60) Provisional application No. 62/669,739, filed on May 10, 2018, provisional application No. 62/530,774, filed on Jul. 10, 2017.

(51) Int. Cl.
*H01J 37/32* (2006.01)

(52) U.S. Cl.
CPC ...... *H01J 37/32183* (2013.01); *H01J 37/321* (2013.01); *H01J 37/32174* (2013.01); *H01J 37/32642* (2013.01); *H01J 37/32697* (2013.01); *H01J 37/32715* (2013.01)

(58) Field of Classification Search
CPC .......... H01J 37/32183; H01J 37/32715; H01J 37/32697; H01J 37/321; H01J 37/32642; H01J 37/32174; H01J 2237/327; H01J 2237/332; H01J 2237/334; H01J 37/1471; H01J 37/32091; H01J 37/3211; H01J 37/32155; H01J 37/32366; H01J 37/32495; H01J 37/32541; H01J 37/32568; H01J 37/32577; H01J 34/32642; H01L 21/67069; H01L 21/67103; H01L 21/6831; H01L 21/6833; Y10T 279/23
See application file for complete search history.

(56) References Cited

U.S. PATENT DOCUMENTS

| | | |
|---|---|---|
| 6,847,014 B1 | 1/2005 | Benjamin et al. |
| 9,583,357 B1 | 2/2017 | Long et al. |

(Continued)

*Primary Examiner* — Renan Luque
(74) *Attorney, Agent, or Firm* — Patterson + Sheridan, LLP

(57) ABSTRACT

The present disclosure relates to apparatus and methods that manipulate the amplitude and phase of the voltage or current of an edge ring. The apparatus includes an electrostatic chuck having a chucking electrode embedded therein for chucking a substrate to the electrostatic chuck. The apparatus further includes a baseplate underneath the substrate to feed power to the substrate. The apparatus further includes an edge ring disposed over the electrostatic chuck. The apparatus further includes an edge ring electrode located underneath the edge ring. The apparatus further includes a circuit including a first variable capacitor coupled to the edge ring electrode.

13 Claims, 20 Drawing Sheets

(56) References Cited

U.S. PATENT DOCUMENTS

| | | | |
|---|---|---|---|
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 10,115,568 B2 | 10/2018 | Kellogg et al. | |
| 10,763,081 B2 * | 9/2020 | Cui | H01J 37/32642 |
| 2005/0051095 A1 | 3/2005 | Kikuchi et al. | |
| 2009/0071938 A1 | 3/2009 | Dhindsa et al. | |
| 2012/0000887 A1 | 1/2012 | Eto et al. | |
| 2013/0072025 A1 * | 3/2013 | Singh | H01L 21/67069 |
| | | | 156/345.52 |
| 2013/0288483 A1 * | 10/2013 | Sadjadi | H01J 37/32082 |
| | | | 438/758 |
| 2017/0018411 A1 | 1/2017 | Sriraman et al. | |
| 2017/0069462 A1 | 3/2017 | Kanarik et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0178917 A1 | 6/2017 | Kamp et al. | |
| 2017/0213753 A1 | 7/2017 | Rogers | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0316935 A1 | 11/2017 | Tan et al. | |
| 2017/0330734 A1 | 11/2017 | Lee et al. | |
| 2017/0330786 A1 | 11/2017 | Genetti et al. | |
| 2017/0334074 A1 | 11/2017 | Genetti et al. | |
| 2017/0338140 A1 | 11/2017 | Pape | |
| 2017/0372912 A1 | 12/2017 | Long et al. | |
| 2018/0025891 A1 * | 1/2018 | Marakhtanov | H01L 21/68735 |
| | | | 438/714 |
| 2018/0366305 A1 | 12/2018 | Nagami et al. | |
| 2019/0198298 A1 | 6/2019 | Hirose et al. | |

* cited by examiner

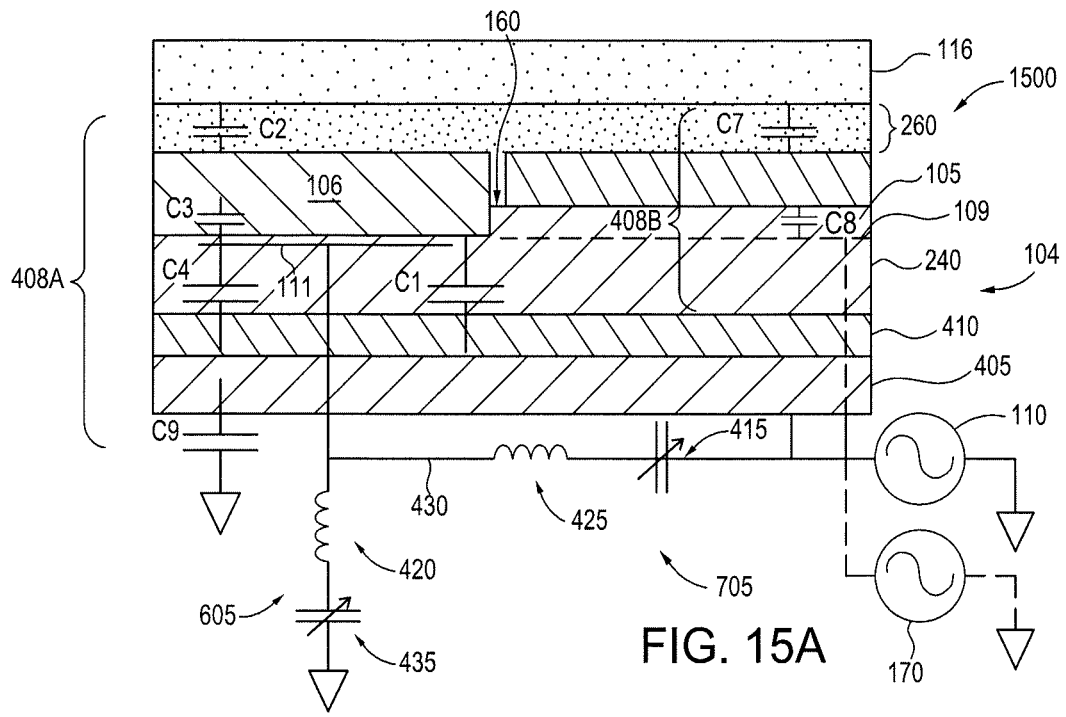
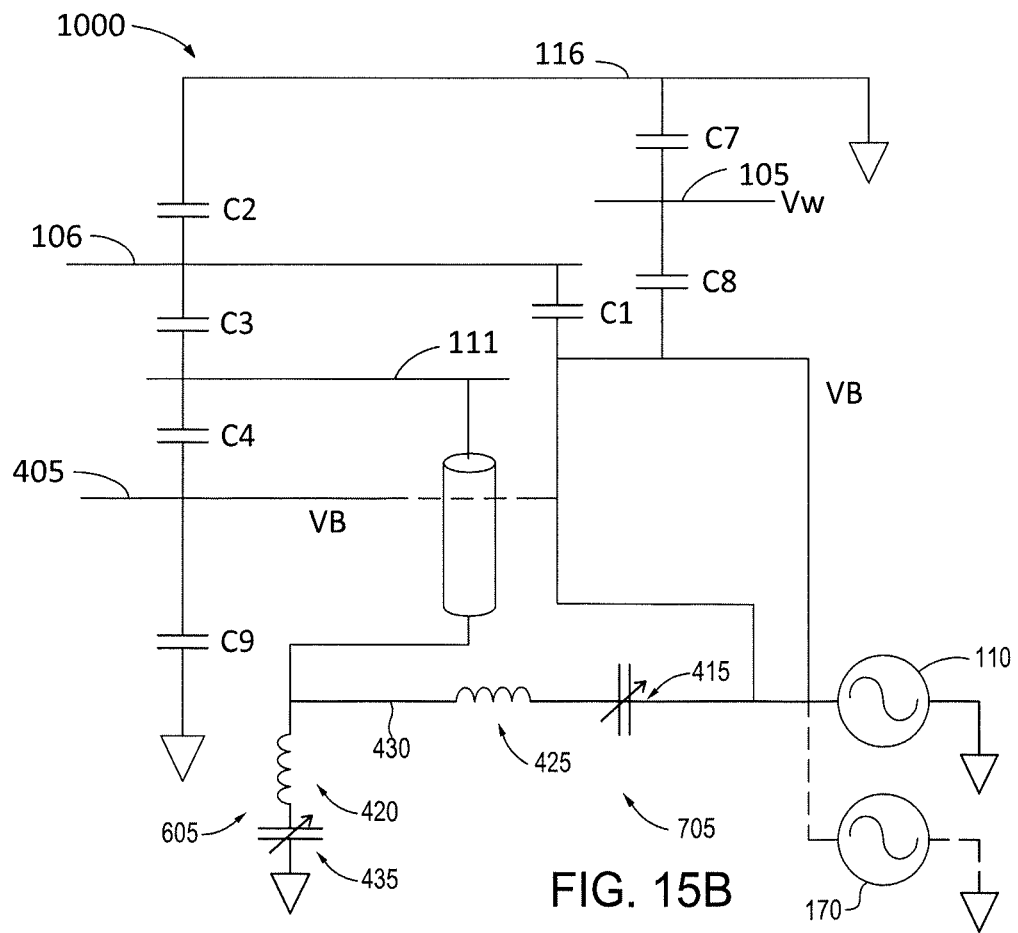

APPARATUS AND METHODS FOR MANIPULATING POWER AT AN EDGE RING IN PLASMA PROCESS DEVICE

CROSS-REFERENCE TO RELATED APPLICATIONS

This application is a continuation application of U.S. patent application Ser. No. 16/994,190 filed on Aug. 14, 2020 which claims priority to U.S. patent application Ser. No. 16/030,356, filed on Jul. 9, 2018, which claims benefit of U.S. Provisional Patent Application Ser. No. 62/530,774, filed Jul. 10, 2017, and U.S. Provisional Patent Application Ser. No. 62/669,739, filed May 10, 2018, each of which is hereby incorporated by reference herein in its entirety.

BACKGROUND

Field

Examples of the present disclosure generally relate to a plasma processing chamber, and more particularly, to an apparatus and methods for manipulating power at an edge ring to control the plasma sheath in the plasma processing chamber.

Description of the Related Art

An edge ring is a circular component which surrounds a perimeter of a substrate, such as a semiconductor substrate, during plasma processing in a process chamber. Due to exposure of the edge ring to plasma within the process chamber, the edge ring may erode and require replacement or maintenance after a predetermined interval. When the edge ring is severely eroded, the shape of the plasma sheath at the edge of the substrate distorts and changes the plasma processing characteristics at the edge of the substrate. The change in plasma processing characteristics causes undesirable processing effects at the edge of the substrate, thus reducing the usable yield near the edge of the substrate. Other methods and apparatus for controlling a plasma sheath exist, such as edge rings which are movable relative to the substrate. However, certain electronic device manufacturing processes are subject to stringent particle requirements which make moving parts undesirable.

Therefore, there is a need for apparatus and methods that address edge ring erosion to improve the process uniformity on a substrate.

SUMMARY

The present disclosure provides apparatus and methods for manipulating the voltage at the edge ring, which can perform as an effective tuning knob to control the process profile near a substrate edge. Manipulating the edge ring's voltage can improve the process uniformity on a substrate. Also, controlling the edge ring's voltage can assist in controlling the verticality (i.e., tilting) of features formed near the substrate edge.

In one aspect, the apparatus includes an electrostatic chuck having a chucking electrode embedded therein for chucking a substrate to the electrostatic chuck. The apparatus further includes a baseplate underneath the substrate to feed power to the substrate. Power can also be fed to the substrate using the chucking electrode. The apparatus further includes an edge ring disposed around the electrostatic chuck. The apparatus further includes an edge ring electrode located underneath the edge ring. The apparatus further includes a circuit including a first variable capacitor coupled to the edge ring electrode.

In another aspect, the apparatus includes an electrostatic chuck having a chucking electrode embedded therein for chucking a substrate to the electrostatic chuck. The apparatus further includes a baseplate underneath the substrate to feed radio frequency (RF) power to the substrate. RF power can also be fed to the substrate using the chucking electrode. The apparatus further includes an edge ring disposed around the electrostatic chuck. The apparatus further includes an edge ring electrode located underneath the edge ring. The apparatus further includes an RF circuit including a first variable capacitor coupled to the edge ring electrode.

In another aspect, the apparatus includes a process chamber that includes a chamber body, a lid disposed on the chamber body, an inductively coupled plasma apparatus positioned above the lid, and a substrate support positioned within the chamber body. The substrate support includes an electrostatic chuck having a chucking electrode embedded therein. The substrate support further includes a baseplate underneath the chucking electrode to feed RF power to the substrate. The substrate support further includes an edge ring electrode located about a periphery of the baseplate. The process chamber further includes an RF circuit comprising a first variable capacitor, a first inductor, and a second inductor coupled to the edge ring electrode.

In another aspect, a method of operating a process chamber comprises monitoring an amplitude ratio and phase difference between voltages of an edge ring and a substrate by monitoring an amplitude ratio and phase difference between the voltages of an edge ring electrode and a chucking electrode. The method further includes adjusting an RF power source such that the chucking electrode maintains a constant amplitude of voltage by adjusting an RF circuit including at least one variable capacitor coupled to the edge ring electrode. The method further includes tuning the at least one variable capacitor to obtain a target amplitude of the voltage at the edge ring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 15A and 15B illustrate schematic circuit diagrams illustrating one embodiment of an RF circuit.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to apparatus and methods that power provided to a substrate support assembly. The apparatus and methods include an electrode that is coupled to ground through a variable capacitor and optionally an inductor. The electrode may be ring-shaped and embedded in a substrate support that includes an electrostatic chuck. The electrode may be positioned beneath the perimeter of a substrate and/or an edge ring positioned on a perimeter of the substrate support. As the plasma sheath drops adjacent the edge ring due to edge ring erosion, the capacitance of the variable capacitor is adjusted in order to affect the power amplitude near the edge of the substrate. Adjustment of the power amplitude via the electrode and variable capacitor results in an adjustment of the plasma sheath near the substrate perimeter. Bending of the sheath at the perimeter of the substrate will either focus ions (increase etch rate) or de-focus ions (decrease etch rate) in the region of approximately 0 mm-10 mm (depending on the process condition) from the edge of the substrate.

The present disclosure also addresses the need to compensate for extreme edge non-uniformities left by previous process steps. In all of these applications, when the process is very sensitive to particles, for example in logic circuit applications, it is considered a high risk to have moving parts in the vicinity of the substrate. The present disclosure addresses the need for extreme edge tunability with no moving parts.

Figure 1:
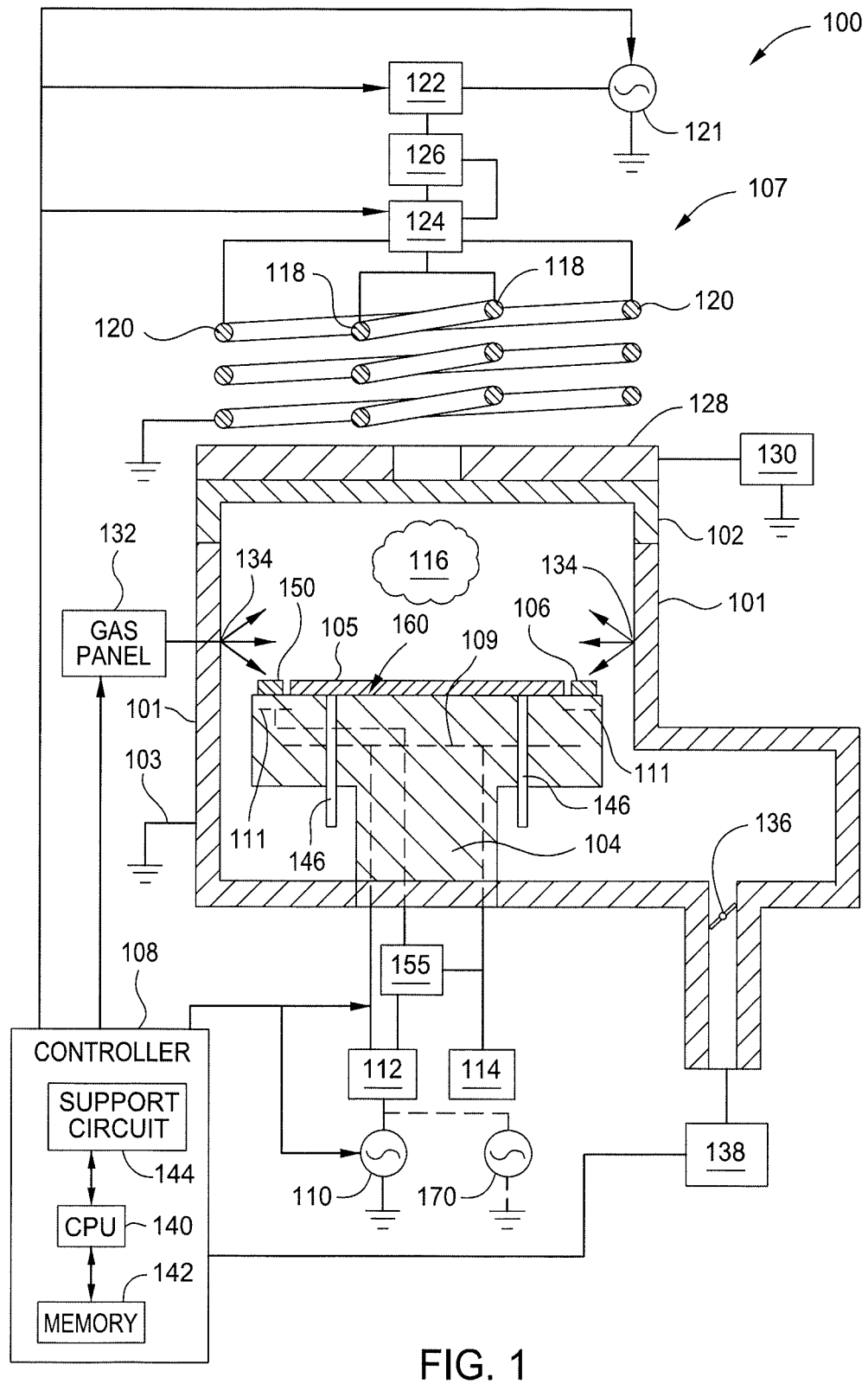
FIG. 1 is a schematic sectional view of a process chamber according to one embodiment of the disclosure.

FIG. 1 is a schematic sectional view of a process chamber 100, according to one example of the disclosure. The process chamber 100 includes a chamber body 101 and a lid 102 disposed thereon that together define an inner volume. The chamber body 101 is typically coupled to an electrical ground 103. A substrate support assembly 104 is disposed within the inner volume to support a substrate 105 thereon during processing. An edge ring 106 is positioned around the periphery of the substrate 105 on the substrate support assembly 104. The process chamber 100 also includes an inductively coupled plasma apparatus 107 for generating a plasma of reactive species within the process chamber 100, and a controller 108 adapted to control systems and subsystems of the process chamber 100.

The substrate support assembly 104 includes one or more electrodes, such as a first electrode 109 and a second electrode, such as an edge ring electrode 111 are coupled to a RF power source 110 (at a first frequency and, in some embodiments, alternatively to a second RF power source 170 at a second frequency. Unless otherwise noted, hereinafter "the RF power source 110") through a matching network 112 and a tuning circuit 155 including variable capacitors and inductors. The RF power source 110 is utilized to bias the substrate 105 disposed on an upper surface 160 of the substrate support assembly 104. The RF power source 110 may illustratively be a source of up to about 1,000 W (but not limited to about 1,000 W) of RF energy, which may be provided by one or multiple frequencies, such as 13.56 MHz and 2 MHz. In another embodiment, the RF power source 110 may be two separate power sources with different frequencies, e.g., 2 MHz and 13.56 MHz, which can be used separately or together. The RF power source 110 may be capable of producing either or both of continuous or pulsed power. The first electrode 109 is coupled to a chucking power source 114 to facilitate chucking of the substrate 105 to the upper surface 160 during processing. The bias RF source 110 can be delivered to the substrate 105 either through coupling to the baseplate 210 or connecting to the substrate electrode 109.

The inductively coupled plasma apparatus 107 is disposed above the lid 102 and is configured to inductively couple RF power into the process chamber 100 to generate a plasma 116 within the process chamber 100. The inductively coupled plasma apparatus 107 includes first and second coils 118, 120, disposed above the lid 102. The relative position, ratio of diameters of each coil 118, 120, and/or the number of turns in each coil 118, 120 can each be adjusted as desired to control the profile or density of the plasma 116 being formed. Each of the first and second coils 118, 120 is coupled to an RF power source 110 through a matching network 122 via an RF feed structure 124. The RF power source 110 may illustratively be capable of producing up to about 4000 W (but not limited to about 4000 W) at a tunable frequency in a range from 50 kHz to 13.56 MHz, although other frequencies and powers may be utilized as desired for particular applications.

In some examples, a power divider 126, such as a dividing capacitor, may be provided between the RF feed structure 124 and the RF power supply 121 to control the relative quantity of RF power provided to the respective first and second coils 118, 120. In some examples, the power divider 126 may be incorporated into the matching network 122.

A heater element 128 may be disposed on the lid 102 to facilitate heating the interior of the process chamber 100. The heater element 128 may be disposed between the lid 102 and the first and second coils 118, 120. In some examples, the heater element 128 may include a resistive heating element and may be coupled to a power supply 130, such as an AC power supply, configured to provide sufficient energy to control the temperature of the heater element 128 within a desired range.

During operation, the substrate 105, such as a semiconductor wafer or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the inner volume of the chamber body 101. The process gases are ignited into a plasma 116 in the process chamber 100 by applying power from the RF power supply 121 to the first and second coils 118, 120. In some examples, power from the RF power source 110, such as an RF or a pulsed DC source, may also be provided through the matching network 112 to electrodes 109 within the substrate support assembly 104. The pressure within the interior of the process chamber 100 may be controlled using a valve 136 and a vacuum pump 138. The temperature of the chamber body 101 may be controlled using fluid-containing conduits (not shown) that run through the chamber body 101.

The process chamber 100 includes the controller 108 to control the operation of the process chamber 100 during processing. The controller 108 comprises a central processing unit (CPU) 140, a memory 142, and support circuits 144 for the CPU 140 and facilitates control of the components of the process chamber 100. The controller 108 may be one of any form of general-purpose computer processor that can be used in an industrial setting for controlling various chambers and sub-processors. The memory 142 stores software (source or object code) that may be executed or invoked to control the operation of the process chamber 100 in the manner described herein.

During processing, an upper surface 150 of the edge ring 106 may become eroded. The erosion changes the plasma characteristics which may alter the plasma 116 at or near the edge of the substrate 105. In one embodiment, the software of the memory 142 comprises the instructions for manipulating various RF circuits provided in this disclosure to obtain a target amplitude and phase of the voltage at the edge ring 106 in order to tune the process profile and/or feature tilting on the edge of the substrate 105.

Figure 2A:
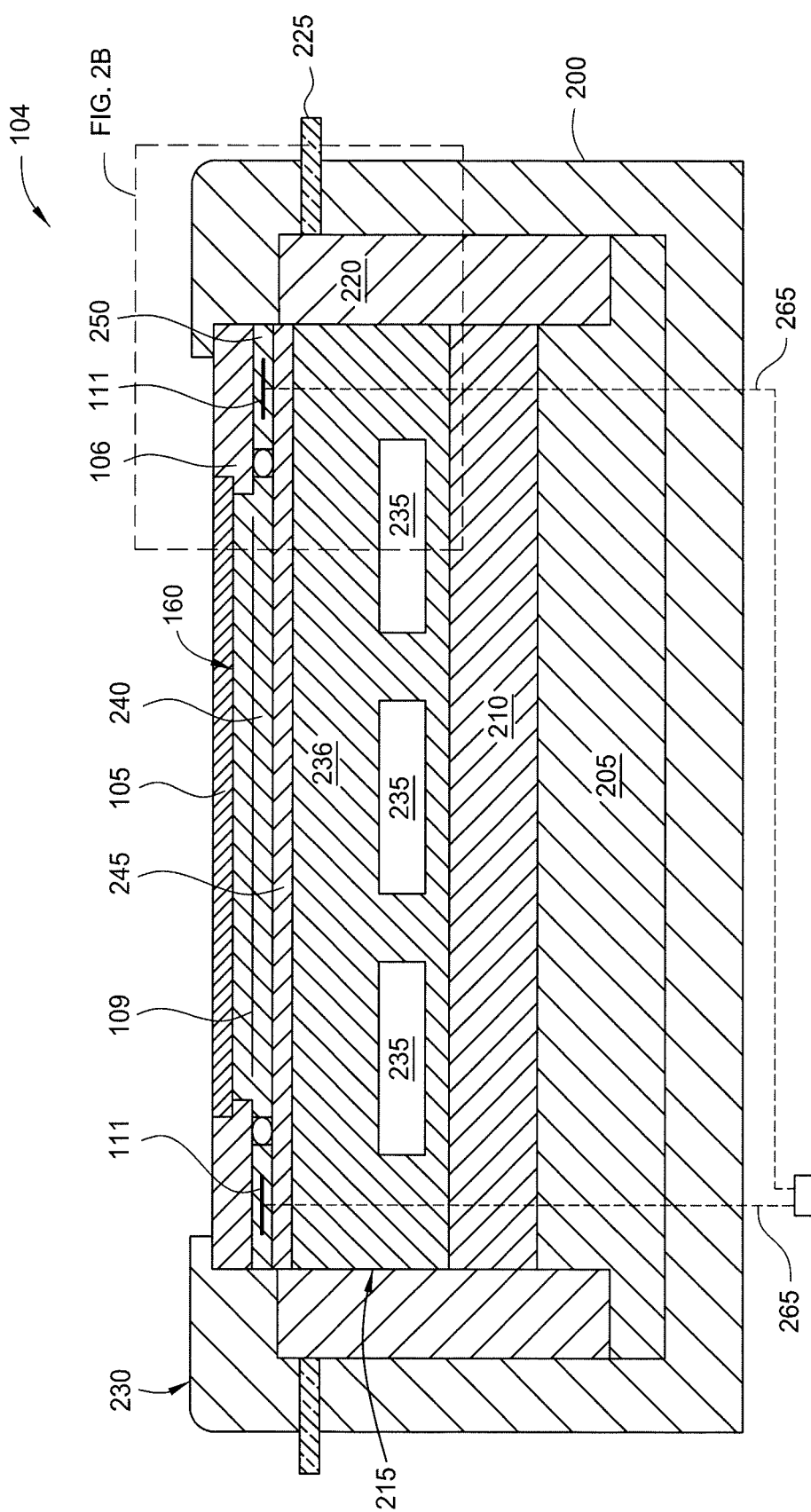
FIGS. 2A and 2B illustrate enlarged schematic views of the substrate support shown in FIG. 1.
Figure 2B:
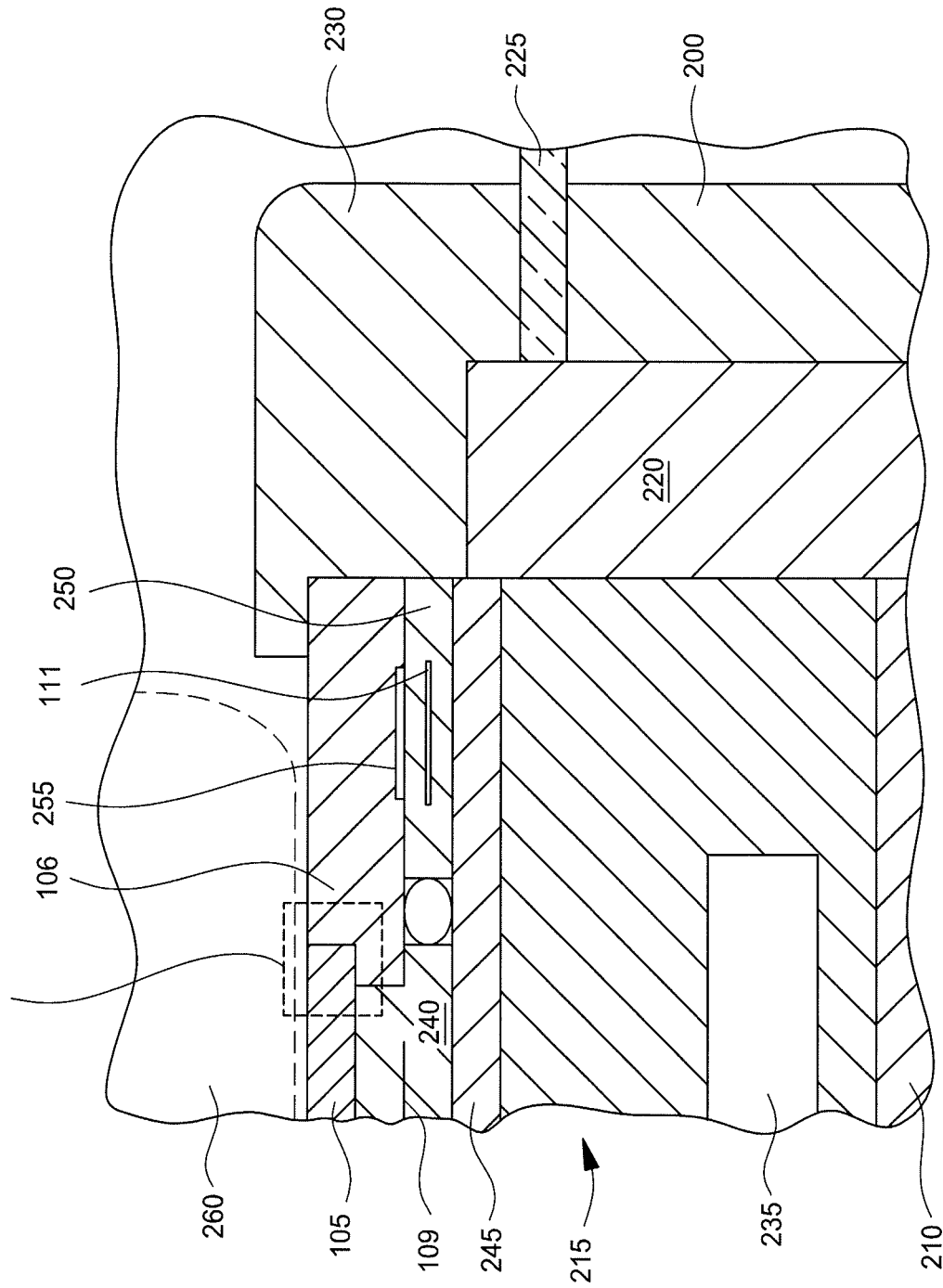

FIGS. 2A and 2B illustrate enlarged schematic views of the substrate support assembly 104 shown in FIG. 1. The substrate support assembly 104 includes a ground plate 200 surrounding an insulating layer 205, a facilities plate 210, and an electrostatic chuck 215 assembled in a vertical stack. A quartz pipe ring 220 circumscribes the facilities plate 210 and the electrostatic chuck 215 to insulate the RF-hot electrostatic chuck 215 from the ground plate 200. A plasma shield 225 is disposed on an upper surface of the quartz pipe ring 220 to facilitate plasma containment in the process chamber 100 (shown in FIG. 1). A quartz ring 230 is positioned on an upper surface of the plasma shield 225.

The facilities plate 210 is positioned between a lower portion of the ground plate 200 and the electrostatic chuck 215. The electrostatic chuck 215 includes a one or more channels 235 formed in a first material 236 through which a fluid is provided to facilitate temperature control of the substrate support assembly 104. The first material 236 is a metallic material, such as aluminum. The electrostatic chuck 215 includes the first electrode 109 embedded in a second material 240. The second material 240 is a dielectric material, such as a ceramic material, for example, alumina or aluminum nitride. A heater 245 is disposed adjacent to or in the electrostatic chuck 215 to facilitate temperature control of the substrate 105. The heater 245 may be, for example, a resistive heater having a plurality of resistive heating elements embedded therein.

A ceramic ring 250 surrounds and abuts the radially-outward edges of the second material 240. The ceramic ring 250 may be made of, for example, alumina or aluminum nitride.

The edge ring electrode 111 is embedded in the ceramic ring 250. The edge ring electrode 111 may be positioned about 0.3 millimeters to about 1 millimeter from the upper surface of the ceramic ring 250, such as about 0.75 millimeters. The edge ring electrode 111 may have a width of about 3 millimeters to about 20 millimeters, such as about 6 millimeters.

The edge ring electrode 111 is positioned radially outward of the perimeter of the substrate 105 and beneath the edge ring 106. In one example, the edge ring electrode 111 may have an inner diameter greater than 200 millimeters, or greater than 300 millimeters, or greater than 400 millimeters. The edge ring electrode 111 is electrically coupled to ground and/or matching network 112 through the tuning circuit 155 consisting of variable capacitors and inductors. The edge ring electrode 111 may be coupled to the tuning circuit 155 through multiple transmission lines 265 (two are shown). For example, the edge ring electrode 111 may be coupled to the tuning circuit 155 through three transmission lines 265 spaced about the substrate support assembly 104 at even intervals (e.g., 120 degrees).

The edge ring 106 is positioned over the ceramic ring 250 and in contact with the ceramic ring 250 and the second material 240. In one example, the edge ring 106 may be formed from silicon carbide, graphite coated with silicon carbide, or low resistivity doped silicon. The edge ring 106 circumscribes the substrate 105 and reduces undesired etching or deposition of material at the radially-outward edges of the substrate 105.

Referring to FIG. 2B, during processing, a plasma sheath 260 may form over the surface of the substrate 105 (shown as a dashed line in FIG. 2B). As described above, processing conditions may erode the upper portion of the edge ring 106, causing undesired processing of the edge of the substrate 105, such as rounding, sometimes referred to as a "rollover effect". The undesired processing reduces device yield and affects center-to-edge uniformity. To reduce these undesired effects, conventional approaches frequently replaced the edge ring 106. However, frequent replacement of the edge ring 106 is expensive, because it requires a new edge ring and because replacement of the edge ring 106 requires significant down time.

In contrast to conventional approaches, in examples described herein, the edge ring electrode 111 is coupled to ground and/or a RF source 110 through the tuning circuit 155 to adjust the RF amplitude and/or phase, and thus the plasma sheath 260, near the edge ring 106.

In another embodiment, a thicker or thinner plasma sheath 260 above the edge ring 106 than that above the substrate 105 is desired in order to tune one or a combination of the film etching, deposition profile or feature tilting angle near the substrate edge. Controlling the voltage amplitude and/or phase of the edge ring 106 relative to those on the substrate 105 allows such process edge profile tuning.

Due to the relatively reduced thickness of the ceramic ring 250 in contrast to conventional approaches, RF power initially delivered to the electrostatic chuck 215 has a high RF coupling with the edge ring 106. In other words, the RF amplitude on the edge ring 106 could be higher than the RF amplitude on the substrate 105.

In one optional example, a gap 255 may be provided between an upper surface of the ceramic ring 250 and a lower surface of the edge ring 106. The gap 255 may be utilized to decrease coupling between the edge ring electrode 111 and the plasma sheath 260 to reduce the RF current to tuning circuit 155. The thickness of the gap 255 may be selected to provide a desired amount of decoupling.

In addition to the examples described above, other examples of the disclosure are also contemplated. In one example, the length of the transmission line 265 may have a length that is lambda (wavelength) divided by 2 (e.g., $\lambda/2$) to facilitate matched impedance, in at least one frequency. In another example, it is contemplated that the width of the edge ring electrode 111 may be selected to increase or decrease electrical coupling with the edge ring 106, as desired. In another example, it is contemplated that the optional gap 255 may be omitted. In another example, it is contemplated that a conductive thermal gasket, for example, a silicone-based thermal gasket, may occupy the gap 255.

In another example, the tuning circuit 155 may be coupled to the RF power source 110 instead of, or in addition to, ground. In such an example, the tuning circuit 155 would facilitate adjustment of capacitive coupling, rather than a parasitic effect as described above.

Figure 3A:
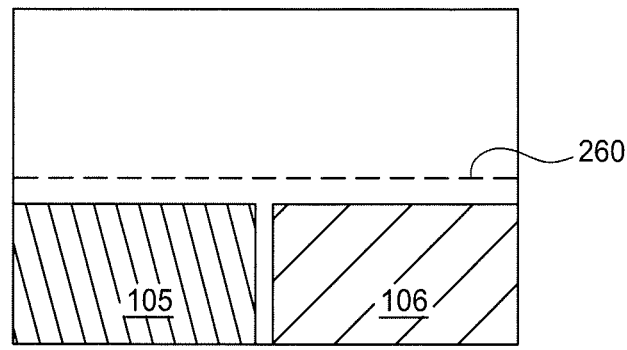
FIGS. 3A-3C are schematic views of a plasma sheath relative to the perimeter of a substrate, according to embodiments of the disclosure.
Figure 3B:
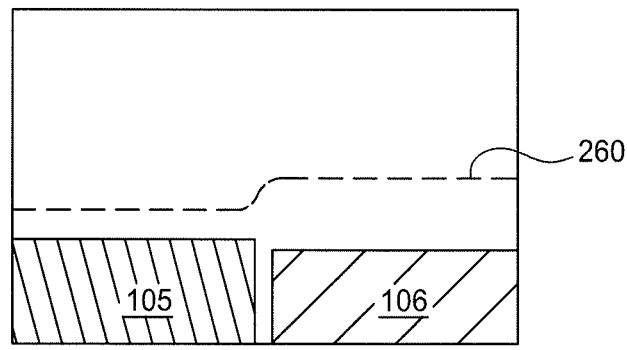
Figure 3C:
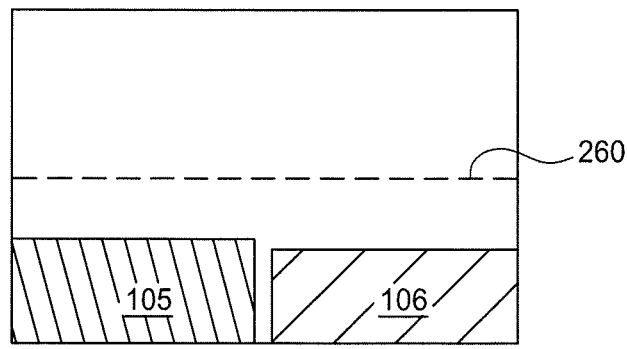

FIGS. 3A-3C are schematic views of a plasma sheath 260 relative to the edge of a substrate 105, according to examples of the disclosure. FIG. 3A illustrates the plasma sheath 260 relative to an edge ring 106 and a substrate 105 prior to erosion of the edge ring 106.

As illustrated in FIG. 3A, the upper surface of the edge ring 106 and the substrate 105 are generally coplanar prior to erosion of the edge ring 106. Prior to erosion of the edge ring 106, the plasma sheath 260 is substantially parallel with and equally spaced from the upper surfaces of the edge ring 106 and the substrate 105. The profile of the plasma sheath 260 illustrated in FIG. 3A results in uniform processing of the substrate 105, particular near the radially-outward edge thereof.

After processing a predetermined number of substrates, conditions in the process chamber result in undesired erosion of the edge ring 106. FIG. 3B illustrates an eroded edge ring 106. In one example, the upper surface of the edge ring 106 may be eroded, thereby reducing the thickness of the edge ring 106. The eroded edge ring 106 no longer shares a coplanar upper surface with the substrate 105. Due to the interaction between edge ring 106 and charged particles in a plasma, the profile of the plasma sheath 260 is changed in the presence of the eroded edge ring 106.

As illustrated in FIG. 3B, the plasma sheath 260 is changed at the interface of the substrate 105 and the edge ring 106 and fails to maintain equidistant spacing between the surface of the edge ring 106 and the substrate 105. The profile of the plasma sheath 260 may result in "rounding" or other undesired processing of the radially-outward edge of the substrate 105. Rounding at the substrate edge decreases the usable surface of the substrate 105, thus decreasing device yield per substrate. This undesired rounding may commonly be referred to as the "rollover effect". In conventional systems, to correct this rounding, the eroded edge ring 106 would be replaced, thus increasing direct costs as well as the cost of lost-production due to processing down time. In contrast, examples of the present disclosure utilize an edge ring electrode 111 to adjust the RF amplitude, and then thus the location of the plasma sheath 260, above the eroded edge ring 106.

FIG. 3C illustrates the reestablishment of the original (e.g., planar) profile of the plasma sheath 260 after compensating the eroded edge ring 106 by means of various RF circuits provided in the present disclosure.

The reestablished plasma sheath 260 does not cause a "rollover effect" on the substrate 105, thus preventing damage to the substrate 105 and maximizing the usable surface of the substrate 105. Moreover, because the eroded edge ring 106 may continue to be utilized in an eroded state, the time between preventative maintenances is extended, thereby decreasing processing downtime. Additionally, the eroded edge rings require less frequent replacement, thereby decreasing expenses for consumable parts.

Figure 4A:
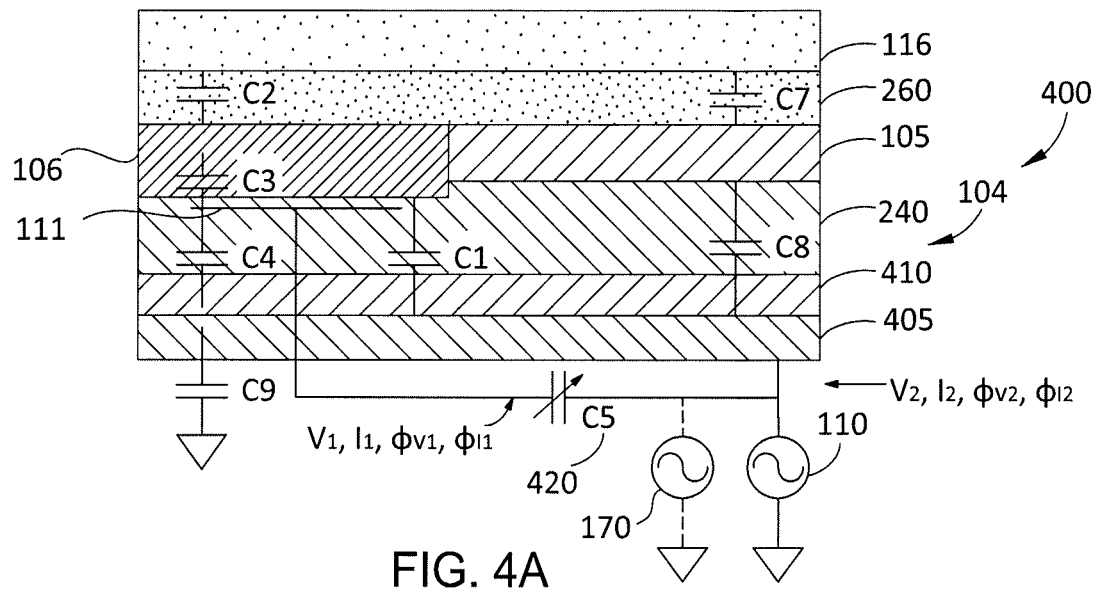
FIGS. 4A and 4B illustrate schematic circuit diagrams illustrating one embodiment of a radio frequency (RF) circuit.
Figure 4B:
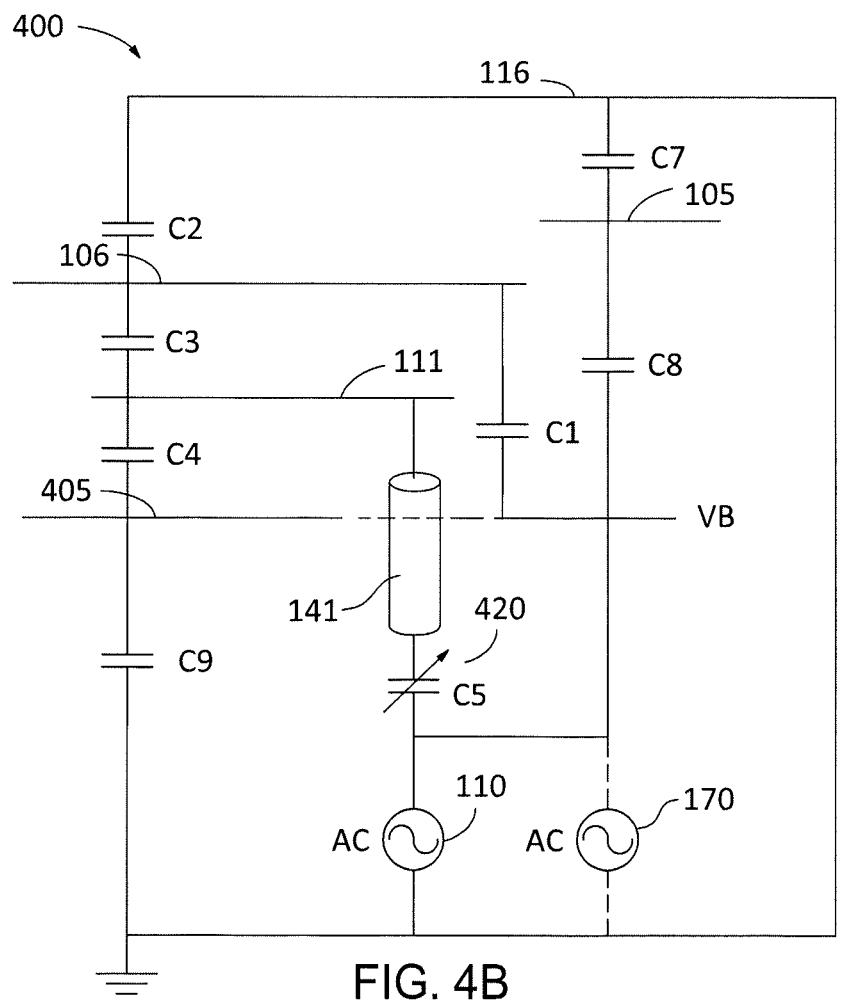

FIGS. 4A and 4B are schematic circuit diagrams illustrating one embodiment of a RF circuit 400. FIGS. 4A and 4B illustrate the RF circuit 400 within the substrate support assembly 104. To facilitate explanation, FIG. 4A illustrates the RF circuit 400 overlaid on a partial view of the substrate support assembly 104. The RF circuit 400 describes the functional relationships among components of a system. The RF circuit 400 may be a portion of the tuning circuit 155 shown in FIG.

In the RF circuit 400, a capacitance element C1 is present between the baseplate 405 and an edge ring 106. A capacitance element C2 is present between the edge ring 106 and a plasma 116. A capacitance element C3 is a capacitance between the edge ring 106 and an edge ring electrode 111. A capacitance element C4 is present between the edge ring electrode 111 and the baseplate 405. A capacitance element C7 is present between the substrate 105 and the plasma 116. A capacitance element C8 is a capacitance between the substrate 105 and baseplate 405. A capacitance element C9 is present between the baseplate 405 and the ground.

In one embodiment, the baseplate 405 corresponds to the facilities plate 210 (shown in FIGS. 2A and 2B). In another embodiment, a bond layer 410 can correspond to the heater 245 (shown in FIGS. 2A and 2B).

In this embodiment, the variable capacitor C5 420 is coupled to the RF power source 110 and to the edge ring electrode 111 through one or more transmission lines, providing a path for power to the edge ring electrode 111. When the power is applied to the edge ring electrode 111, RF voltage and current develop at the edge ring 106 as a result of coupling.

In some embodiments, voltages (e.g., V1, V2), currents (e.g., I1, I2), and their phases (e.g., $\phi v1$, $\phi v2$, $\phi i1$, $\phi i2$) can be measured at the edge ring electrode 111 and the baseplate 405. Using the measured voltages, currents, and their phases at these points, the controller 108 monitors a voltage ratio of edge ring and substrate 105 and a phase difference between the voltages of the edge ring 106 and the substrate 105. Additionally or alternatively, the controller 108 monitors a current amplitude ratio and phase difference between edge ring 106 and substrate 105.

Based on the monitoring results, the variable capacitor C5 420 can be adjusted to manipulate voltage or current applied to the edge ring electrode 111, which affects the voltage or current developed at the edge ring 106. Consequently, the height of the plasma sheath 260 above the edge ring 106 can be changed. The total RF power input can be also adjusted in order to keep the voltage of the substrate 105 constant for minimal process impact on the center of the substrate 105.

Figure 5A:
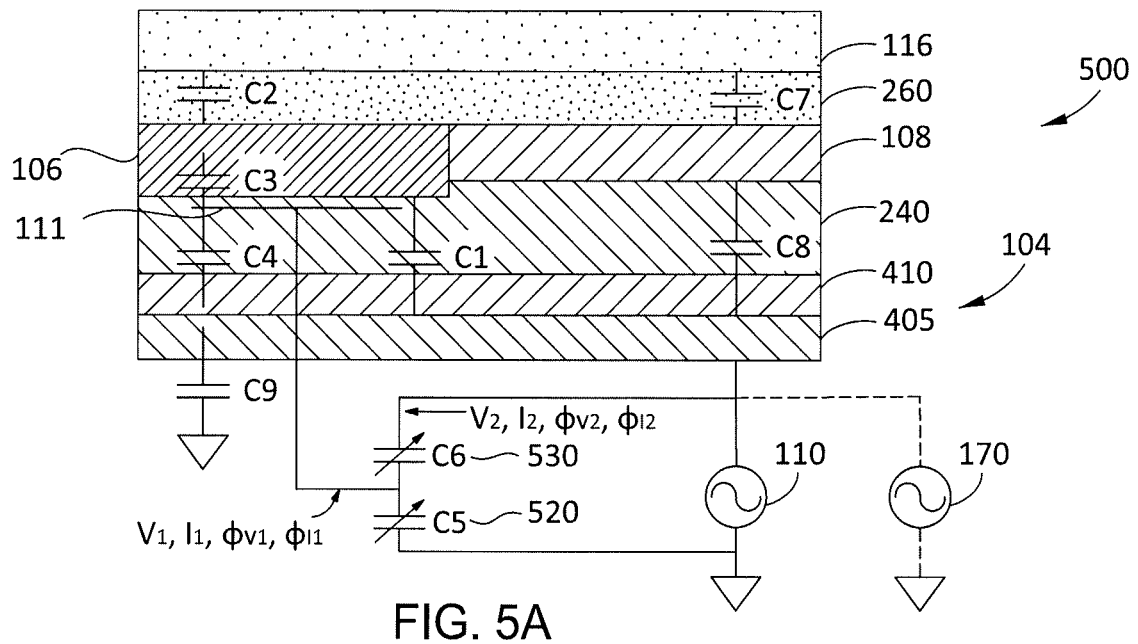
FIGS. 5A and 5B illustrate schematic circuit diagrams illustrating one embodiment of an RF circuit.
Figure 5B:
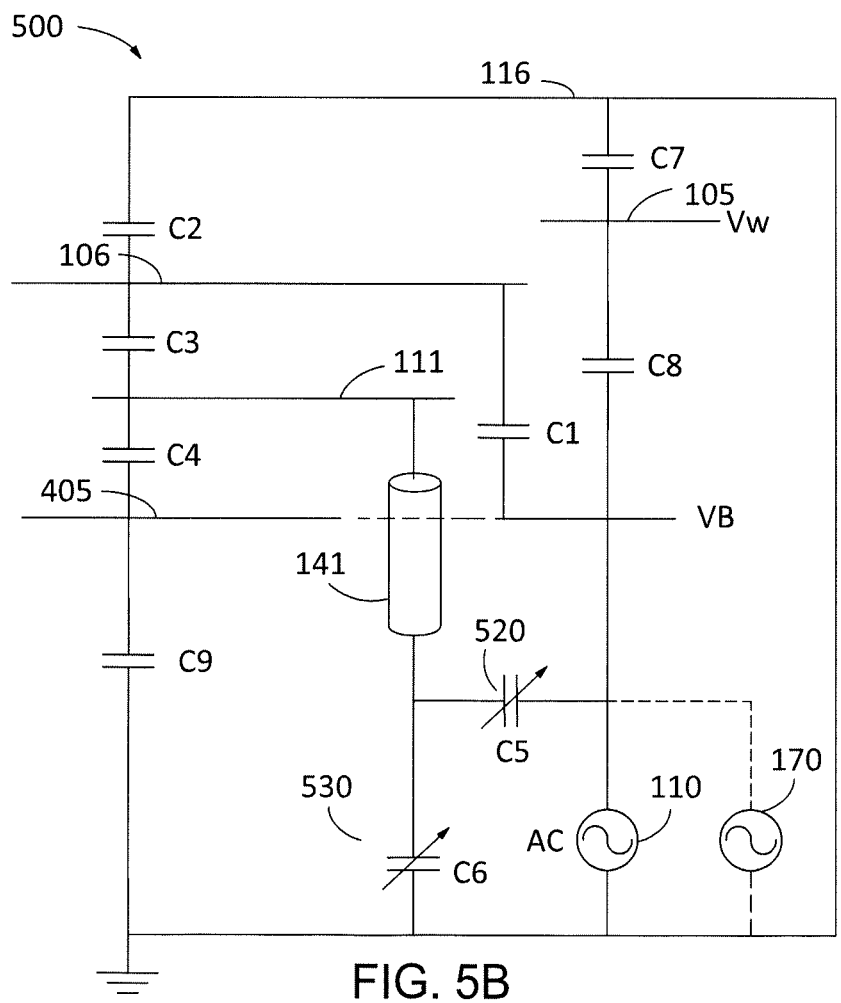

FIGS. 5A and 5B are schematic circuit diagrams illustrating another embodiment of a RF circuit 500. FIGS. 5A and 5B illustrate the RF circuit 500 within the substrate support assembly 104. The RF circuit 500 includes the capacitance elements C1, C2, C3, C4, C7, C8 and C9, which are described in the above embodiment illustrated in FIGS. 4A and 4B, thus descriptions thereof are omitted.

The RF circuit 500 includes a variable capacitor C5 520 that is coupled to the RF power source 110 and to the edge ring electrode 111 through one or more transmission lines 141, providing a path for power to the edge ring 106. A variable capacitor C6 530 is also coupled to ground and to a point between the edge ring electrode 111 and variable capacitor C5 520.

In some embodiments, voltages (e.g., V1, V2), currents (e.g., I1, I2), and their phases (e.g., ɸv1, ɸv2, ɸi1, ɸi2) can be measured at the edge ring electrode 111 and the baseplate 405, respectively. Using the measured voltages, currents, and their phases at these points, the controller 108 monitors a voltage ratio of edge ring 106 and substrate 105 and a phase difference between the voltages of the edge ring 106 and the substrate 105. Additionally or alternatively, the controller 108 monitors a current amplitude ratio and phase difference between edge ring 106 and substrate 105.

Based on the monitoring results, the variable capacitors C5 520 and C6 530 can be tuned to manipulate voltage or current applied to the edge ring electrode 111. In one embodiment, the variable capacitor C5 520 can be used to increase the amplitude of voltage applied to the edge ring electrode 111, and the variable capacitor C6 530 can be used to decrease the amplitude of voltage applied to the edge ring electrode 111. Alternatively, C5 520 can decrease the amplitude of voltage applied to the edge ring electrode 111, and C6 530 can increase the amplitude of voltage applied to the edge ring electrode 111.

In another embodiment, the variable capacitor C5 520 can be used to increase the amplitude of the current applied to the edge ring electrode 111. Alternatively, C6 530 can be used to decrease the amplitude of the current applied to the edge ring electrode 111. The total RF power input can be also adjusted in order to keep the voltage of the substrate 105 constant for minimal process impact on the center of the substrate 105.

Figure 6A:
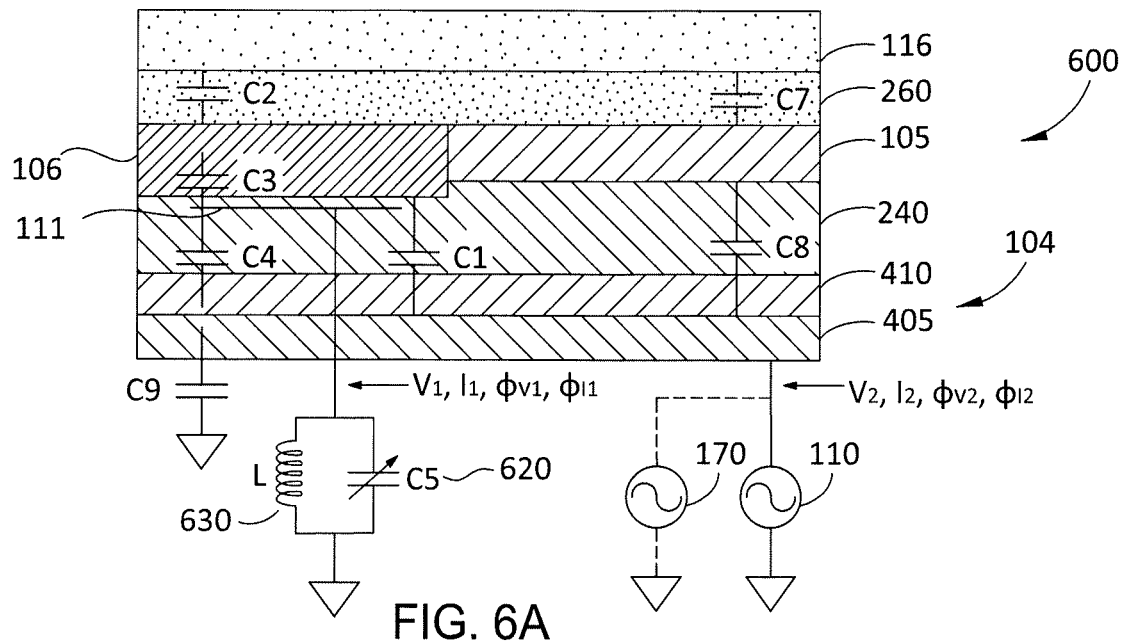
FIGS. 6A and 6B illustrate schematic circuit diagrams illustrating one embodiment of an RF circuit.
Figure 6B:
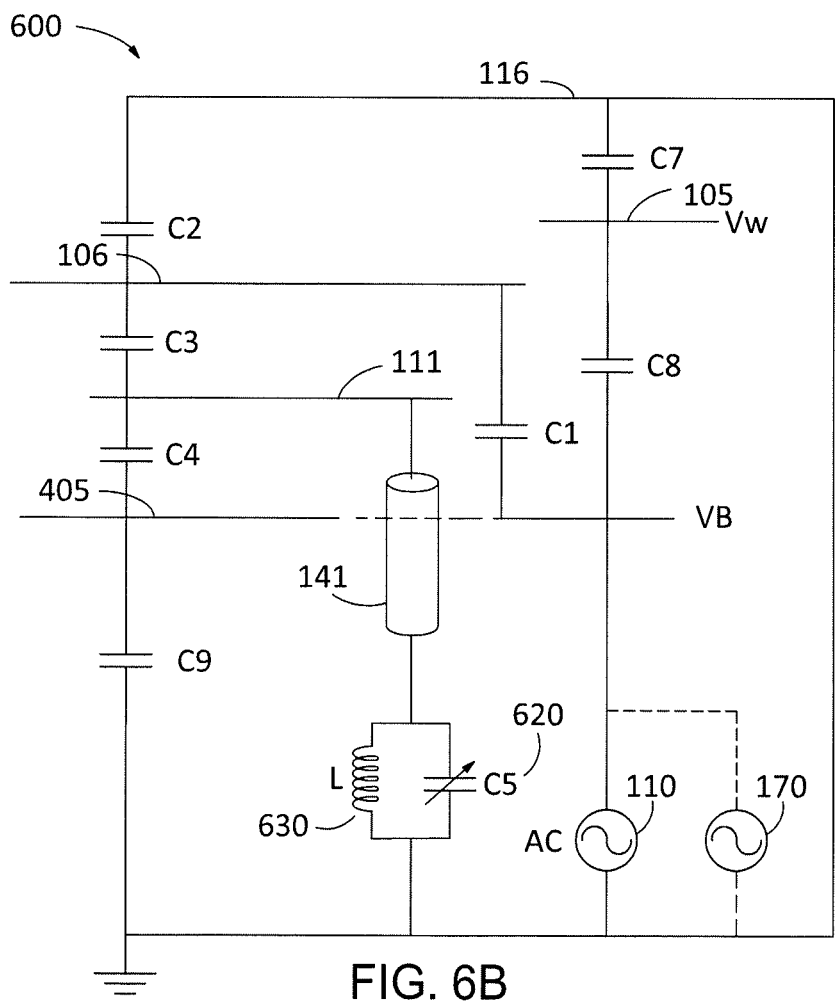

FIGS. 6A and 6B are schematic circuit diagrams illustrating another embodiment of an RF circuit 600. The RF circuit 600 includes the capacitance elements C1, C2, C3, C4, C7, C8 and C9, which are described in the above embodiment illustrated in FIGS. 4A and 4B, thus descriptions thereof are omitted.

The RF circuit 600 includes a parallel LC resonant circuit coupled to the ground and to the edge ring electrode 111 through one or more transmission lines 141. The parallel LC resonant circuit includes variable capacitor C5 620 and inductor L 630, both coupled to the ground and to the edge ring electrode 111. The controller 108 tunes the parallel LC resonant circuit to manipulate the amplitude and phase of voltage or current applied to the edge ring electrode 111 by adjusting the variable capacitance C5 620.

In some embodiments, voltages (e.g., V1, V2), currents (e.g., I1, I2), and their phases (e.g., ɸv1, ɸv2, ɸi1, ɸi2) can be measured at the edge ring electrode 111 and the baseplate 405, respectively. Using the measured voltages, currents, and their phases at these points, the controller 108 monitors a voltage ratio of edge ring 106 and substrate 105 and a phase difference between the voltages of the edge ring 106 and the substrate 105. Additionally or alternatively, the controller 108 monitors the current amplitude ratio and the phase difference between the edge ring 106 and the substrate 105. The total RF power input can be also adjusted in order to keep the voltage of the substrate 105 constant for minimal process impact on the center of the substrate 105.

In the RF circuit 600, the edge ring electrode 111 functions as a center of a voltage divider, between voltages of the edge ring 106 and baseplate 405. As the edge ring 106 is eroded, the parallel LC resonant circuit increases the amplitude of the voltage or current at the edge ring 106 through the edge ring electrode 111 to compensate for any edge ring erosion. The increased RF voltage or current at the edge ring 106 adjusts the location of the plasma sheath 260 to correct for any erosion of the edge ring 106.

In some aspects, to control extreme edge plasma parameters, the RF voltage at the edge ring 106 may be adjusted to be greater than or less than the RF voltage of the substrate 105.

Figure 7A:
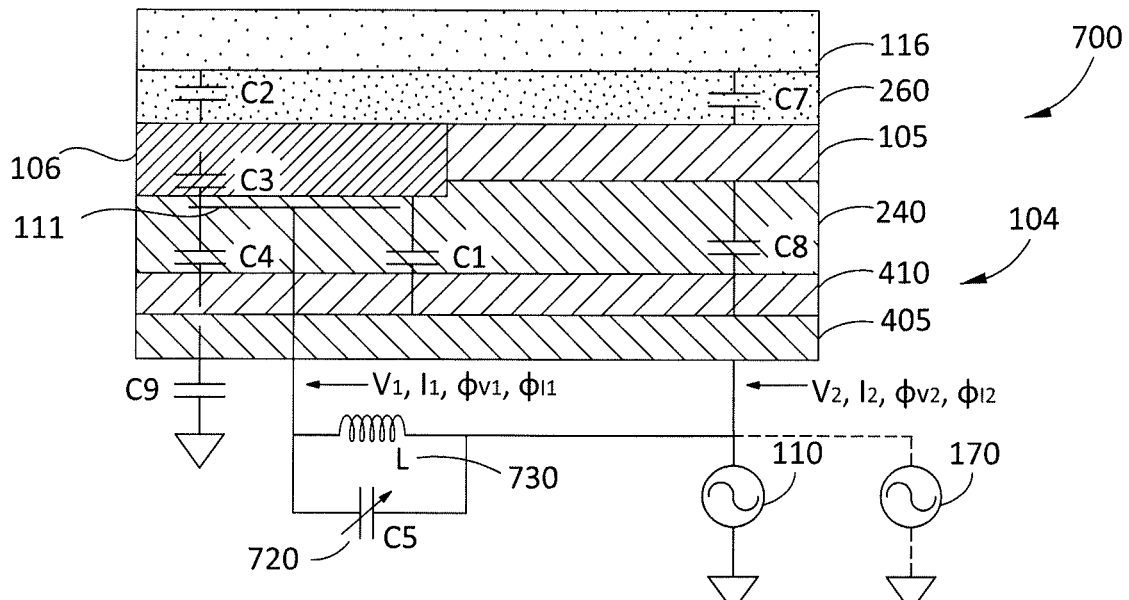
FIGS. 7A and 7B illustrate schematic circuit diagrams illustrating one embodiment of an RF circuit.
Figure 7B:
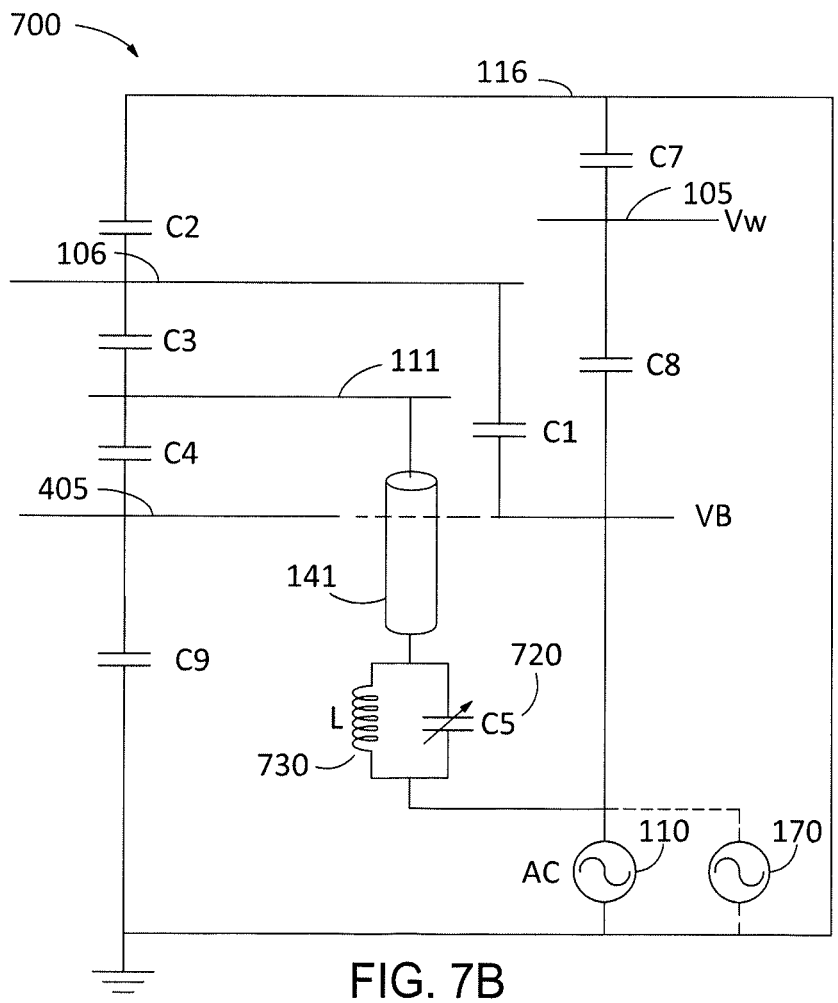

FIGS. 7A and 7B are schematic circuit diagrams illustrating another embodiment of a RF circuit 700. The RF circuit 700 includes the capacitance elements C1, C2, C3, C4, C7, C8 and C9, which are described in the above embodiment illustrated in FIGS. 4A and 4B, thus descriptions thereof are omitted.

The RF circuit 700 includes a parallel LC resonant circuit that is coupled to the RF power source 110 and to the edge ring electrode 111 through one or more transmission lines 141. The parallel LC resonant circuit includes variable capacitor C5 720 and inductor L 730, both coupled to the RF power source 110 and to the edge ring electrode 111. The parallel LC resonant circuit can be tuned to manipulate the amplitude and phase of voltage or current applied to the edge ring electrode 111 by adjusting the variable capacitance C5 720.

In some embodiments, voltages (e.g., V1, V2), currents (e.g., I1, I2), and their phases (e.g., ɸv1, ɸv2, ɸi1, ɸi2) can be measured at the edge ring electrode 111 and the baseplate 405, respectively. Using the measured voltages, currents, and their phases at these points, the controller 108 monitors a voltage ratio of edge ring 106 and substrate 105 and a phase difference between the voltages of the edge ring 106 and the substrate 105. Additionally or alternatively, the controller 108 monitors an amplitude current ratio and phase difference between edge ring 106 and substrate 105.

As described in the above embodiments, based on the monitoring results, the parallel LC resonant circuit can manipulate the voltage or current at the edge ring 106 to adjust the location of the plasma sheath 260 to correct for the erosion of the edge ring 106 or to control the extreme edge plasma parameters. The total RF power input can be also adjusted in order to keep the voltage of the substrate 105 constant for minimal process impact on the center of the substrate 105.

Figure 8A:
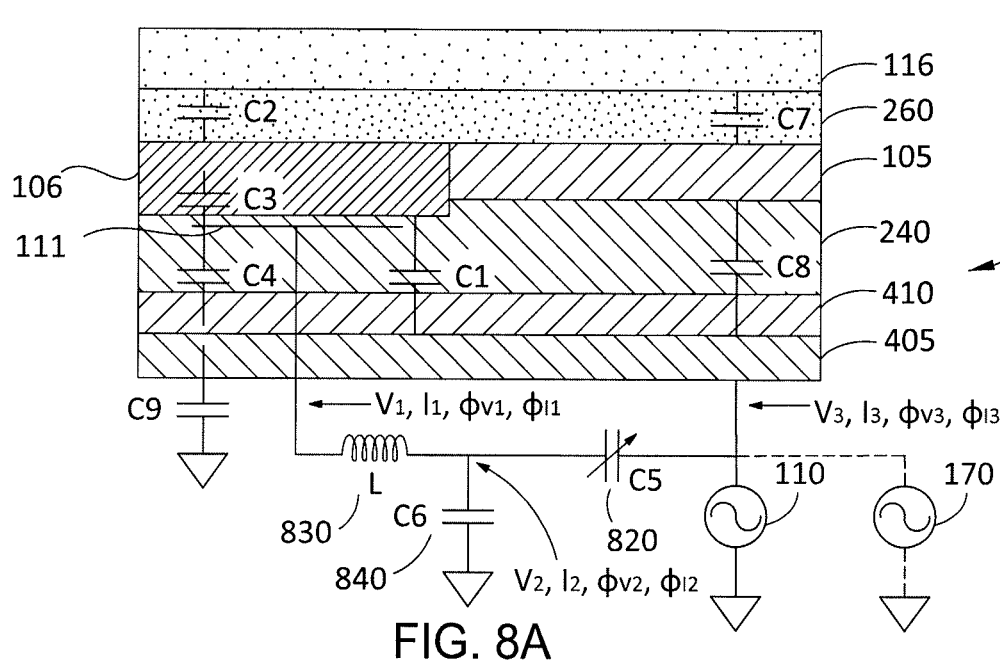
FIGS. 8A and 8B illustrate schematic circuit diagrams illustrating one embodiment of an RF circuit.
Figure 8B:
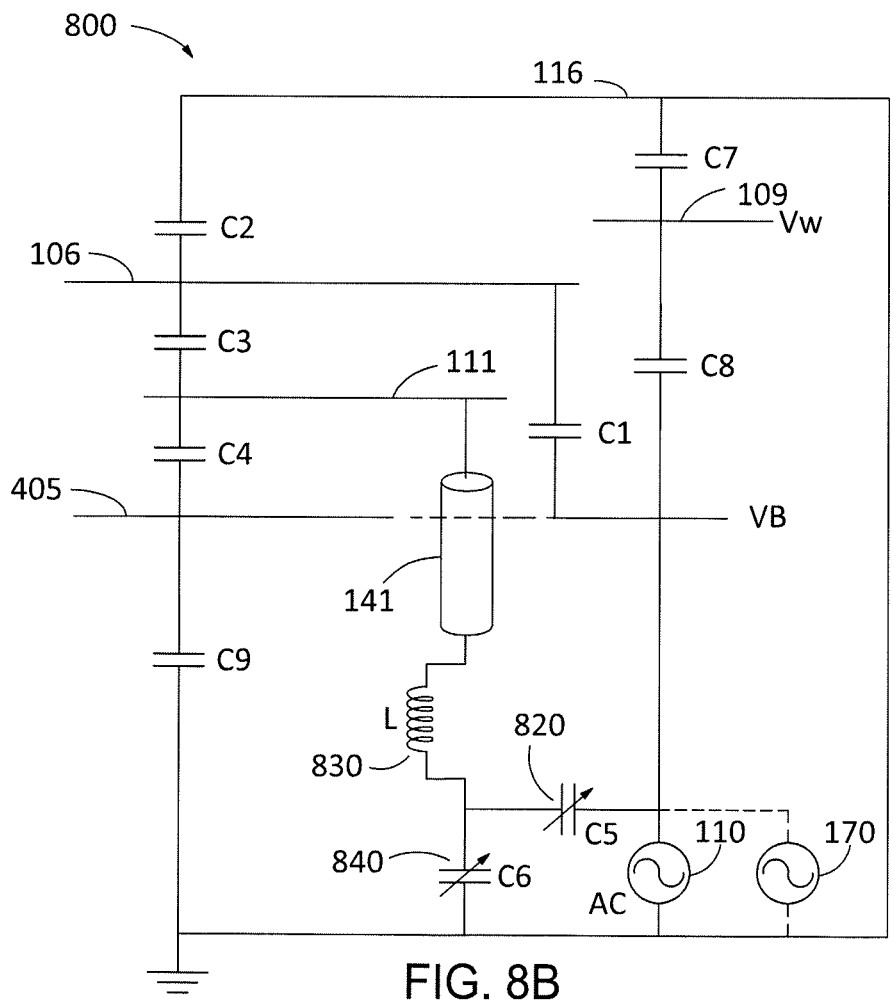

FIGS. 8A and 8B are schematic circuit diagrams illustrating another embodiment of a RF circuit 800. The RF model 800 includes the capacitance elements C1, C2, C3, C4, C7, C8 and C9, which are described in the above embodiment illustrated in FIGS. 4A and 4B, thus descriptions thereof are omitted.

The RF circuit model 800 includes a series LC resonant circuit that is coupled to the RF power source 110 and to the edge ring electrode 111 through one or more transmission lines 141. The serial LC resonant circuit includes variable capacitor C5 820 and inductor L 830 connected in series to the capacitance C5 820. In addition, a variable capacitor C6 840 is coupled to ground and to a point between the inductor L 830 and the variable capacitor C5 820.

In some embodiments, voltages (e.g., V1, V2, V3), currents (e.g., I1, I2, I3), and their phases (e.g., ɸv1, ɸv2, ɸv3, ɸi1, ɸi2, ɸi3) can be measured at the edge ring electrode 111, the baseplate 405, and a point between the inductor and capacitor(s), respectively. Using the measured voltages, currents, and their phases at these points, the controller 108 monitors a voltage ratio of edge ring 106 and substrate 105 and a phase difference between the voltages of the edge ring 106 and the substrate 105. Additionally or alternatively, the controller 108 monitors a current amplitude ratio and phase difference between edge ring 106 and substrate 105. The total RF power input can be also adjusted in order to keep the voltage of the substrate 105 constant for minimal process impact on the center of the substrate 105.

Based on the monitoring results, the controller 108 determines whether to tune the variable capacitors C5 820 and C6 840 to manipulate the voltage or current developed at the edge ring 106 through the edge ring electrode 111, such that the profile of the plasma sheath 260 results in target processing of the substrate 105, particular near the radially-outward edge of the substrate 105.

Figure 9A:
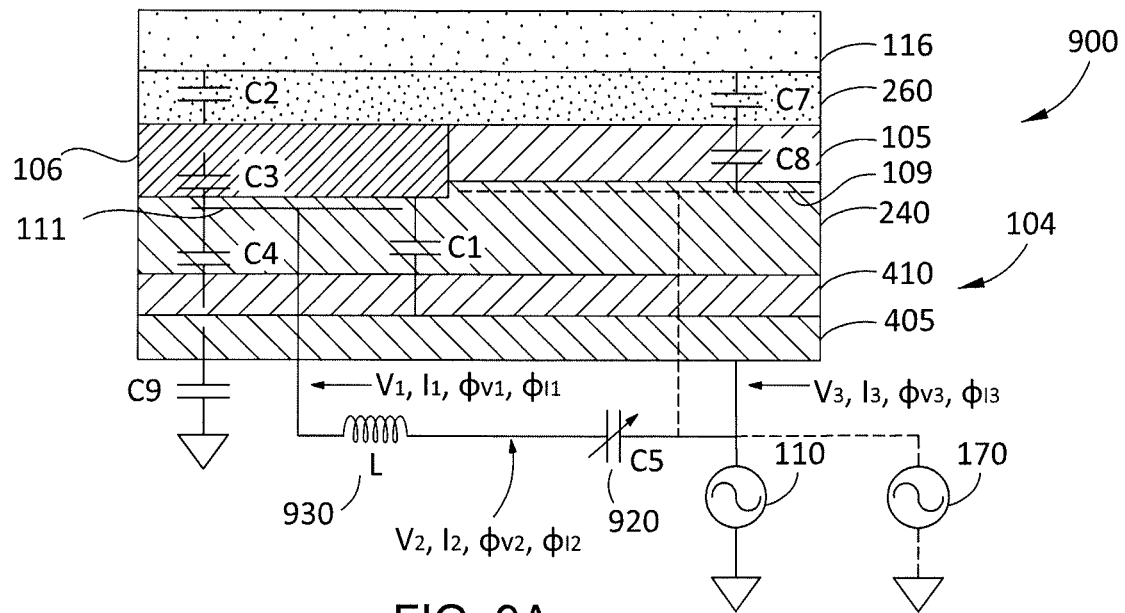
FIGS. 9A and 9B illustrate schematic circuit diagrams illustrating one embodiment of an RF circuit.
Figure 9B:
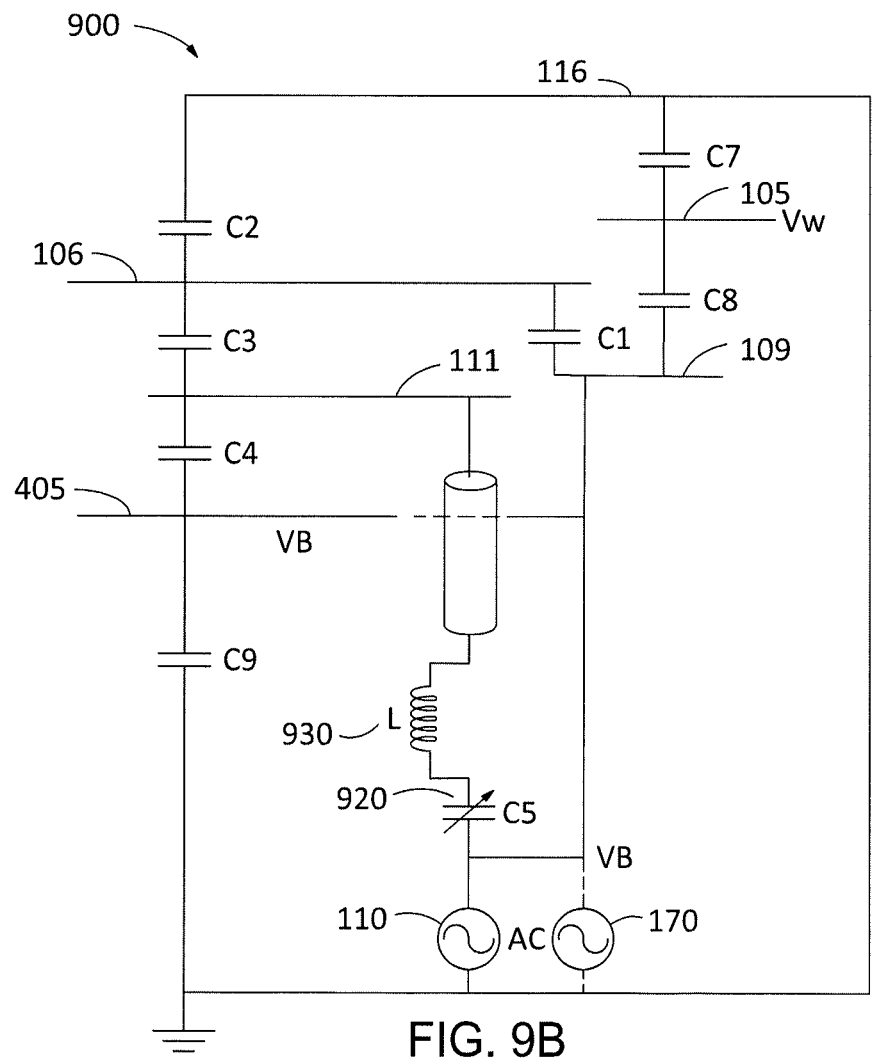

FIGS. 9A and 9B are schematic circuit diagrams illustrating another embodiment of a RF circuit 900. The RF circuit 900 includes capacitance elements C2, C3, C4, C7, and C9, which are described in the above embodiment illustrated in FIG. 4A and also includes a capacitance element C1 between the substrate electrode 109 and the baseplate 405. Capacitance element C8 is between the substrate electrode 109 and substrate 105. The RF power source 110 is coupled to and supplies power to a substrate 105 through a substrate electrode 109 or baseplate 405. This substrate electrode 109 may exist under the substrate 105 in the RF circuits of the other embodiments provided in this disclosure.

The RF circuit 900 includes a serial LC resonant circuit that is coupled to the RF power source 110 and to the edge ring electrode 111 through one or more transmission lines. The serial LC resonant circuit includes a variable capacitor C5 920 coupled to the RF power source 110, and an inductor L 930 coupled to the edge ring electrode 111 and connected in series to the variable C5 920. The RF power source 110 also provides power to the substrate electrode 109 or baseplate 405.

In some embodiments, voltages (e.g., V1, V2, V3), currents (e.g., I1, I2, I3), and their phases (e.g., $\phi v1$, $\phi v2$, $\phi v3$, $\phi i1$, $\phi i2$, $\phi i3$) can be measured at the edge ring electrode 111, the substrate electrode 109 or baseplate 405, and a point between the inductor 930 and the capacitor 920, respectively. Using the measured voltages, currents, and their phases at these points, the controller 108 monitors a voltage ratio of edge ring 106 and substrate and a phase difference between the voltages of the edge ring 106 and the substrate 105. Additionally or alternatively, the controller 108 monitors a current amplitude ratio and phase difference between edge ring 106 and substrate 105.

Based on the monitoring results, the serial LC resonant circuit can be tuned to manipulate the amplitude and phase of voltage or current applied to the edge ring electrode 111. The total RF power input can be also adjusted in order to keep the voltage of the substrate 105 constant for minimal process impact on the center of the substrate 105.

Figure 10A:
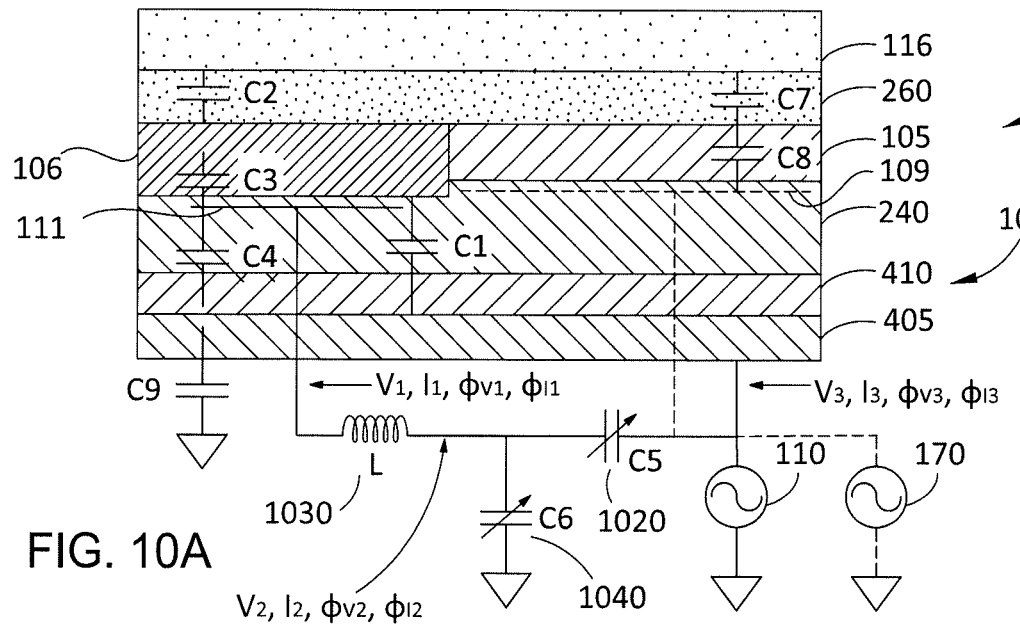
FIGS. 10A and 10B illustrate schematic circuit diagrams illustrating one embodiment of an RF circuit.
Figure 10B:
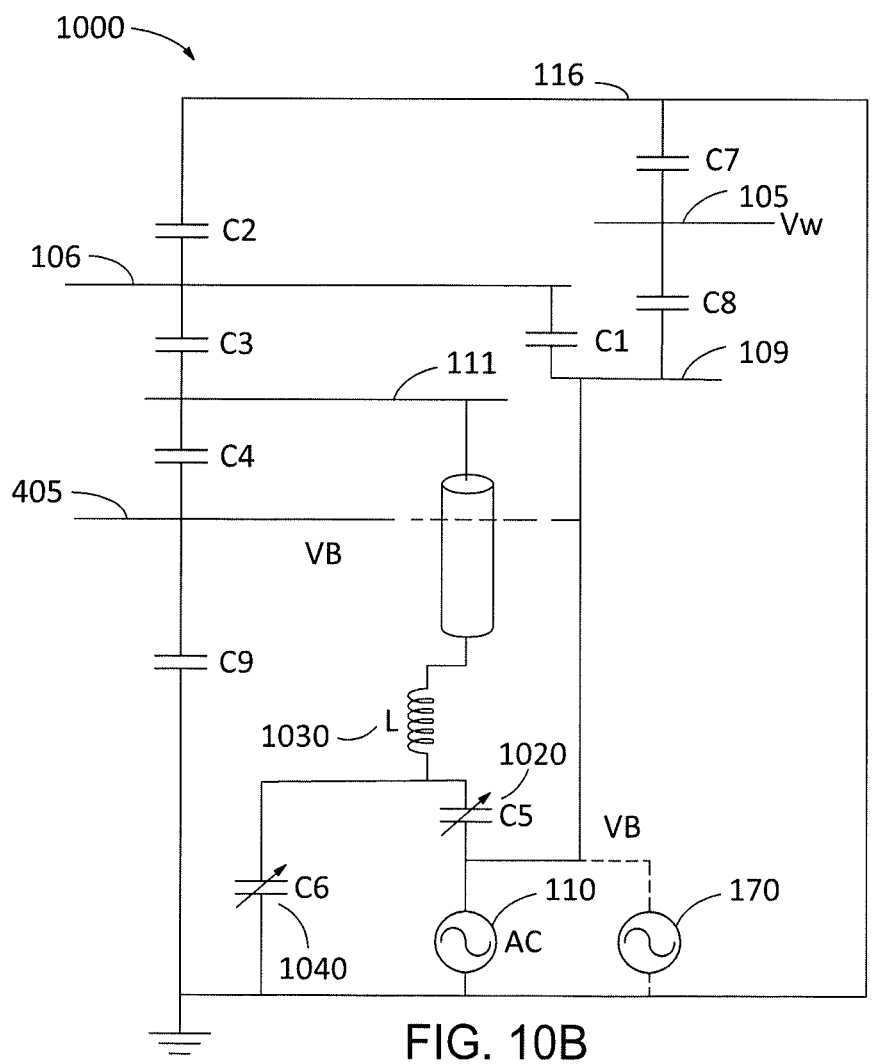

FIGS. 10A and 10B are schematic circuit diagrams illustrating another embodiment of a RF circuit 1000. The RF circuit 1000 includes capacitance elements C2, C3, C4, C7, and C9, which are described in the above embodiment illustrated in FIGS. 4A and 4B, thus descriptions thereof are omitted. Also, the RF power source 110 is coupled and supplies power to a substrate 105 through a substrate electrode 109 or baseplate 405. A capacitance element C1 is present between the substrate electrode 109 and the baseplate 405. Capacitance element C8 is between the substrate electrode 109 and substrate 105.

The RF circuit 1000 includes a serial LC resonant circuit coupled to the RF power source 110 and to the edge ring electrode 111 through one or more transmission lines 141. The serial LC resonant circuit includes a variable capacitor C5 1020 coupled to the RF power source 110, and an inductor L 1030 coupled to the variable capacitor C5 1020 in series and to the edge ring electrode 111. In addition, a variable capacitor C6 1040 is coupled to the ground and to a point between the variable capacitor C5 1020 and inductor L 1030. Variable capacitor C6 1040 can also be adjusted to a resonant condition with inductor 1030.

In some embodiments, voltages (e.g., V1, V2, V3), currents (e.g., I1, I2, I3), and their phases (e.g., $\phi v1$, $\phi v2$, $\phi v3$, $\phi i1$, $\phi i2$, $\phi i2i3$) can be measured at the edge ring electrode 111, the baseplate 405, and a point between the inductor 1030 and the capacitor 1040, respectively. Using the measured voltages, currents, and their phases at these points, the controller 108 monitors a voltage ratio of edge ring and substrate and a phase difference between the voltages of the edge ring 106 and the substrate 105. Additionally or alternatively, the controller 108 monitors a current amplitude ratio and phase difference between edge ring 106 and substrate 105.

Based on the monitoring results, the variable capacitors C5 1020 and C6 1040 can be tuned to manipulate the amplitude and phase of voltage or current applied to the edge ring electrode 111. The total RF power input can be also adjusted in order to keep the voltage of the substrate 105 constant for minimal process impact on the center of the substrate 105.

In the embodiments described above, the tuning circuit 155 may include a capacitive circuit, an LC parallel resonant circuit, or LC serial resonant circuit as illustrated in FIGS. 4A through 10B, in which a variable capacitor C is coupled to the edge ring electrode 111. The resonant frequency of the LC parallel resonant circuit or LC serial resonant circuit can be substantially close to the operating frequency, which enables a large variation of RF amplitude that is much larger and much smaller than the variation of RF amplitude of the substrate 105.

In another embodiment, the tuning circuit 155 can include two LC parallel resonant circuits or two LC serial resonant circuits as illustrated in FIGS. 11 through 15, in which two variable capacitors as well as two inductors are coupled to the edge ring electrode 111. This enables a wide tuning range of edge ring RF voltage and current at two different frequencies.

Figure 11A:
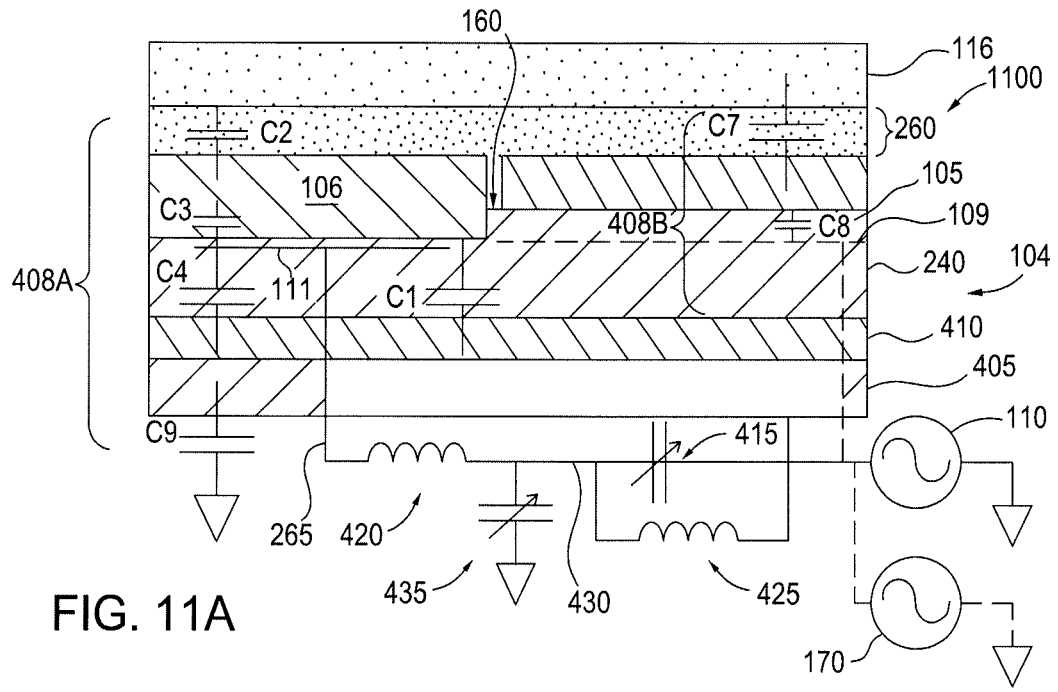
FIGS. 11A and 11B illustrate schematic circuit diagrams illustrating one embodiment of an RF circuit.
Figure 11B:
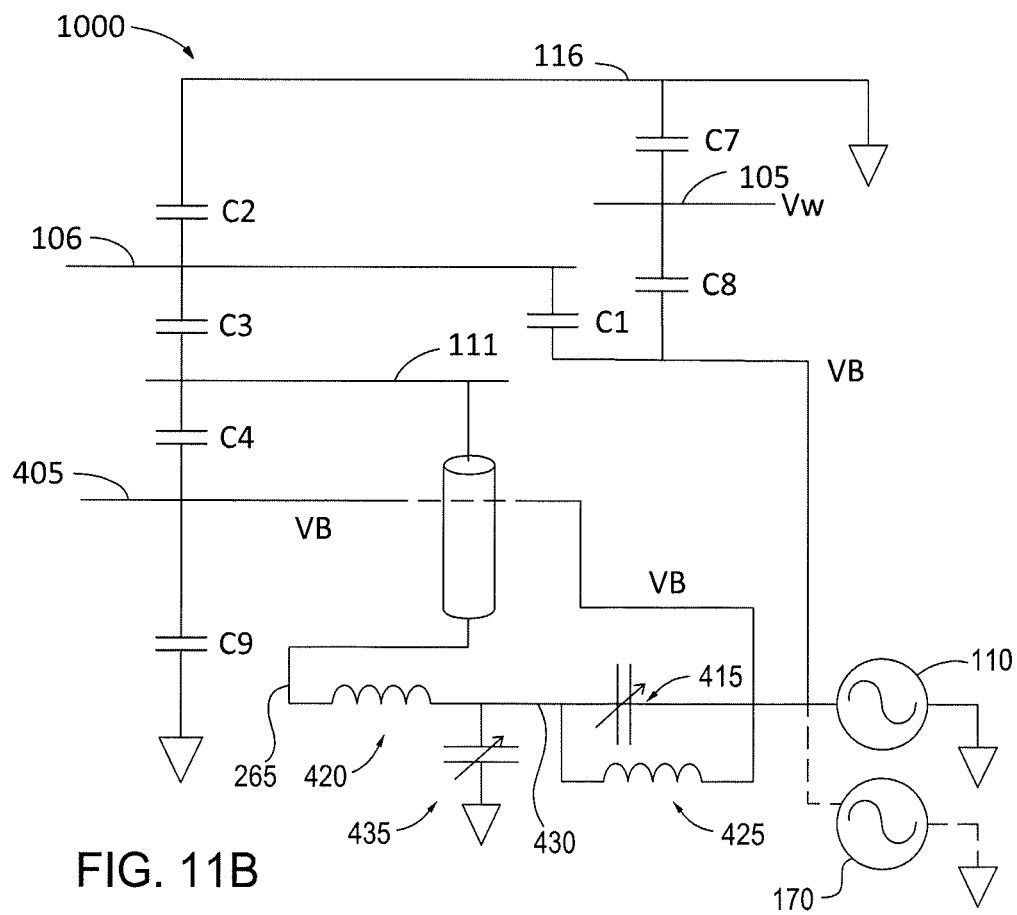

FIGS. 11A and 11B are schematic circuit diagrams illustrating another embodiment of a RF circuit 1100. The RF circuit 1100 may be a portion of the tuning circuit 155 shown in FIG. 1. To facilitate explanation, FIG. 11B illustrates the RF circuit 1100 overlaid on a partial view of the substrate support assembly 104. The RF circuit 1100 describes the functional relationships among components of a system.

In the RF circuit 1100, a capacitance element C1 is present between a baseplate 405 and the edge ring 106. A capacitance element C2 is present between the edge ring 106 and the plasma 116 in the plasma sheath 260. A capacitance element C3 is a capacitance between the edge ring 106 and the edge ring electrode 111. A capacitance element C4 is disposed between the edge ring electrode 111 and the baseplate 405. A capacitance element C7 is present between the substrate 105 and the plasma 116 within the plasma sheath 260. A capacitance element C8 is a capacitance between the substrate 105 and the baseplate 405. A capacitance element C9 is disposed between the baseplate 405 and ground potential. Capacitance elements C2, C3, C4 and C9 correspond to an edge capacitance circuit 408A. Capacitance elements C7 and C8 correspond to a central capacitance circuit 408B.

In one embodiment, the baseplate 405 corresponds to the facilities plate 210 (shown in FIGS. 2A and 2B). In another embodiment, a bond layer 410 can correspond to the heater 245 (shown in FIGS. 2A and 2B).

In this embodiment, a first variable capacitor 415 is coupled to the RF power source 110 and to the edge ring electrode 111 through one or more transmission lines 265, providing a path for power to the edge ring electrode 111. Additionally, a first inductor 420 is provided between the first variable capacitor 415 and the edge ring electrode 111, and one pole (a first pole) of a second inductor 425 is coupled to a signal line 430 between the first variable capacitor 415 and the first inductor 420. A second pole of the second inductor 425 is coupled to the central capacitance circuit 408B. The second inductor 425 may by-pass the first variable capacitor 415. Further, a second variable capacitor 435 is coupled between ground potential and the signal line 430. The arrangement of the first variable capacitor 415 and the second inductor 425 comprises a parallel LC circuit between the baseplate 405 and the edge ring electrode 111.

When the power is applied to the edge ring electrode 111, RF voltage and current develop at the edge ring 106 as a result of coupling. The second inductor 425 enables tuning of high and low voltages at the edge ring electrode 111 at two different frequencies (e.g., 13.56 MHz and 2 MHz). For example, the second inductor 425 enables adjustment of one frequency from the RF power source 110 to the edge ring electrode 111 whether it is a frequency of 13.56 MHz or 2 MHz. Further, varying capacitance at the first variable capacitor 415 and/or the second variable capacitor 435 enables voltage adjustment at the edge ring electrode 111 in either of the two frequencies provided to the edge ring electrode 111 from the RF power source 110. For example, the voltage applied to the edge ring electrode 111 can be varied from zero to two times the voltage applied to the first electrode 109 at either of the two frequencies provided by the RF power source 110 and/or the second RF power source 170.

In some embodiments, voltages (e.g., V1, V2), currents (e.g., I1, I2), and their phases (e.g., $\phi v1$, $\phi v2$, $\phi i1$, $\phi i2$) can be measured at the edge ring electrode 111 and the baseplate 405. Using the measured voltages, currents, and their phases at these points, the controller 108 (FIG. 1) monitors a voltage ratio of edge ring 106 and the substrate 105, and a phase difference between the voltages of the edge ring 106 and the substrate 105. Additionally or alternatively, the controller 108 monitors a current amplitude ratio and phase difference between the edge ring 106 and the substrate 105.

Based on the monitoring results, one or a combination of the first variable capacitor 415 and the second variable capacitor 435 can be adjusted to manipulate voltage or current applied to the edge ring electrode 111, which affects the voltage or current developed at the edge ring 106. Consequently, the height of the plasma sheath 260 above the edge ring 106 can be controlled.

Figure 12A:
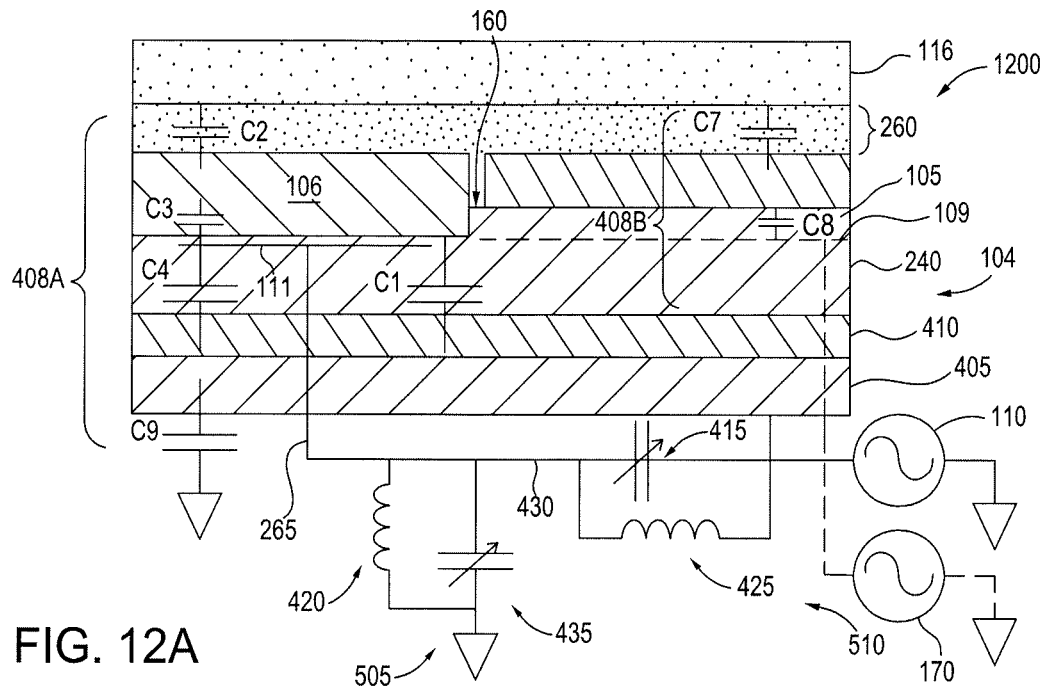
FIGS. 12A and 12B illustrate schematic circuit diagrams illustrating one embodiment of an RF circuit.
Figure 12B:
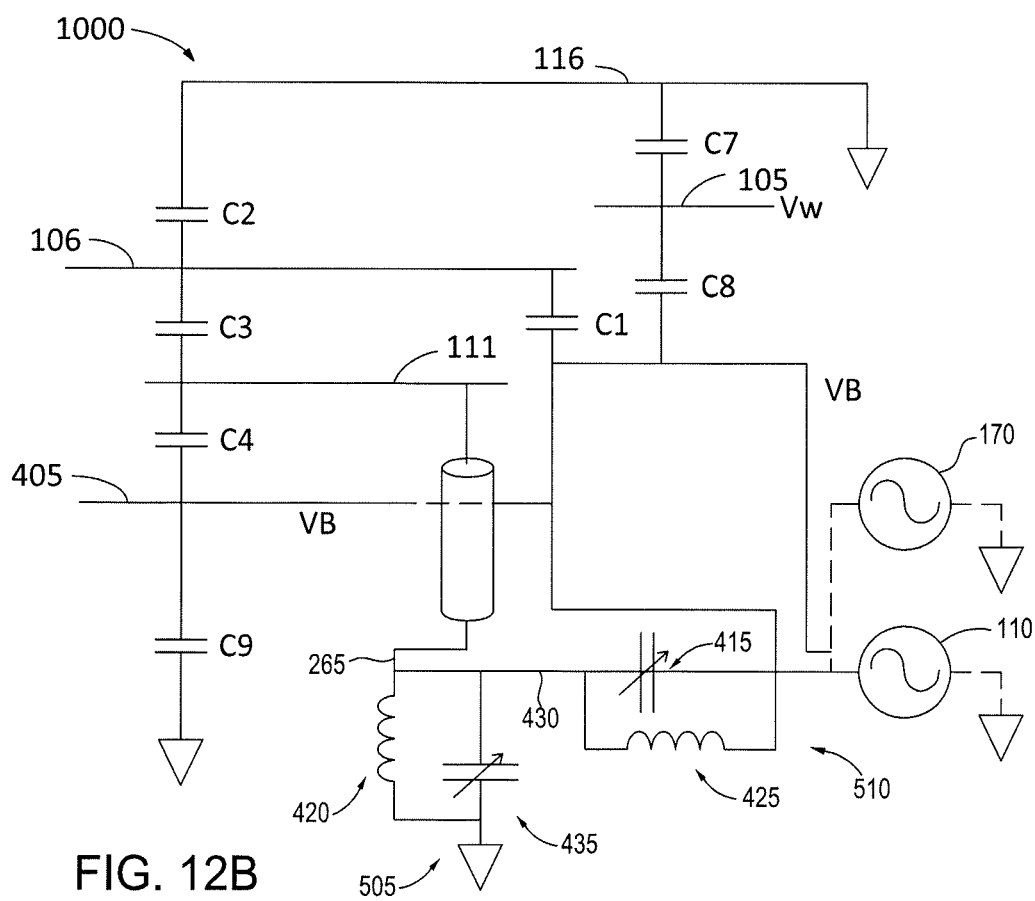

FIGS. 12A and 12B are schematic circuit diagrams illustrating another embodiment of a RF circuit 1200. The RF circuit 1200 may be a portion of the tuning circuit 155 shown in FIG. 1. To facilitate explanation, FIG. 12B illustrates the RF circuit 1200 overlaid on a partial view of the substrate support assembly 104. The RF circuit 1200 describes the functional relationships among components of a system.

The RF circuit 1200 is similar to the RF circuit 1100 with the following exceptions. A first parallel LC circuit 505 is provided between ground potential and the edge ring electrode 111. The first parallel LC circuit 505 comprises the first inductor 420 and the second variable capacitor 435 coupled to the signal line 430. Additionally, a second parallel LC circuit 510 is provided between the baseplate 405 and the edge ring electrode 111. When the parallel resonant circuits 505, 510 are resonant, the edge ring electrode 111 has a high impedance to ground or to the RF power source 110.

Figure 13A:
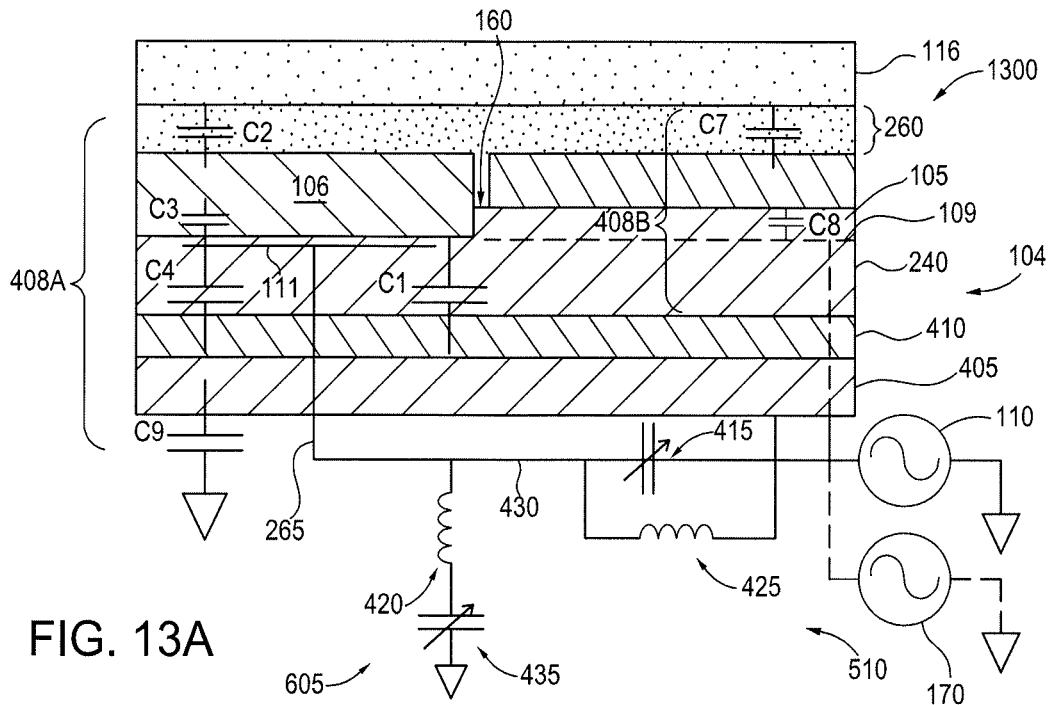
FIGS. 13A and 13B illustrate schematic circuit diagrams illustrating one embodiment of an RF circuit.
Figure 13B:
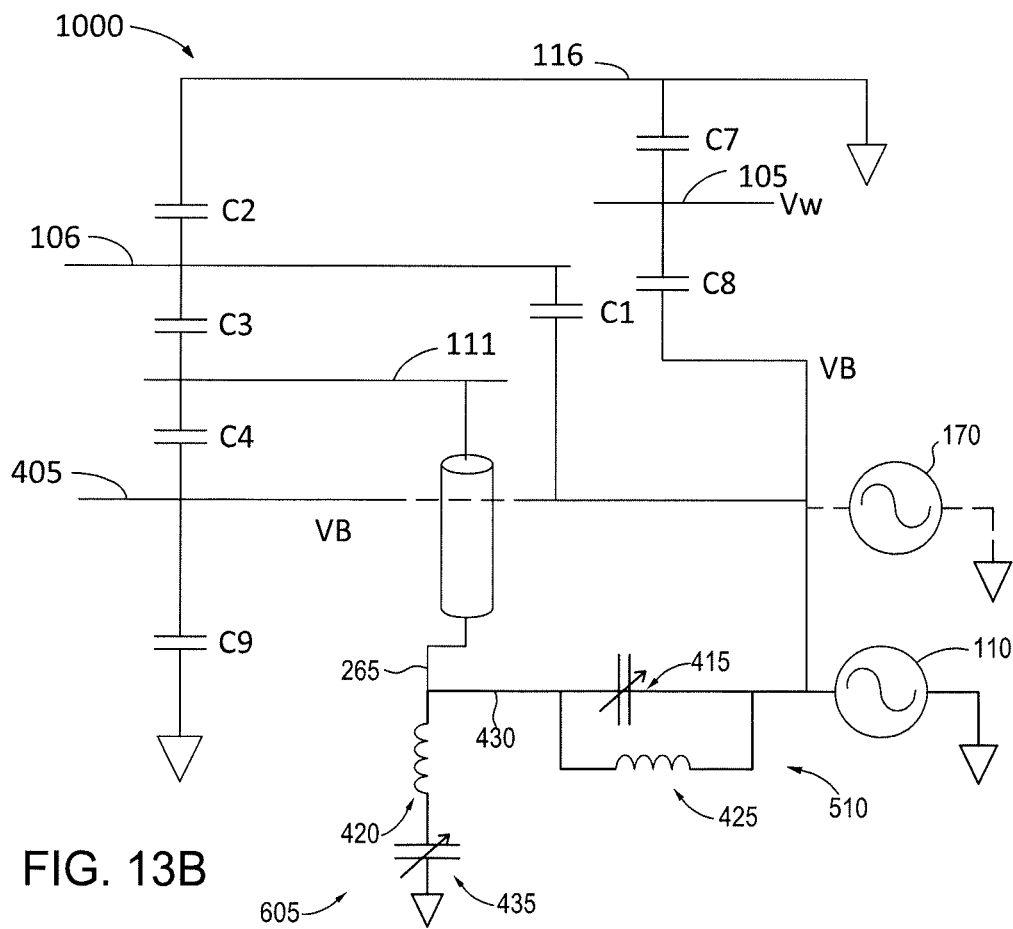

FIGS. 13A and 13B are schematic circuit diagrams illustrating another embodiment of a RF circuit 1000. The RF circuit 1300 may be a portion of the tuning circuit 155 shown in FIG. 1. To facilitate explanation, FIG. 13B illustrates the RF circuit 1300 overlaid on a partial view of the substrate support assembly 104. The RF circuit 1300 describes the functional relationships among components of a system.

The RF circuit 1300 is similar to the RF circuits 1100 and/or 1200 with the following exceptions. A series LC circuit 605 is provided between ground potential and the edge ring electrode 111. The series LC circuit 605 comprises the first inductor 420 and the second variable capacitor 435 coupled to the signal line 430. Additionally, the second parallel LC circuit 510 is provided between the baseplate 405 and the edge ring electrode 111. The series resonant circuit 605 reduces the voltage on the edge ring electrode 111 when resonant, while the parallel resonant circuit 510 varies the coupling to the RF power source 110.

Figure 14A:
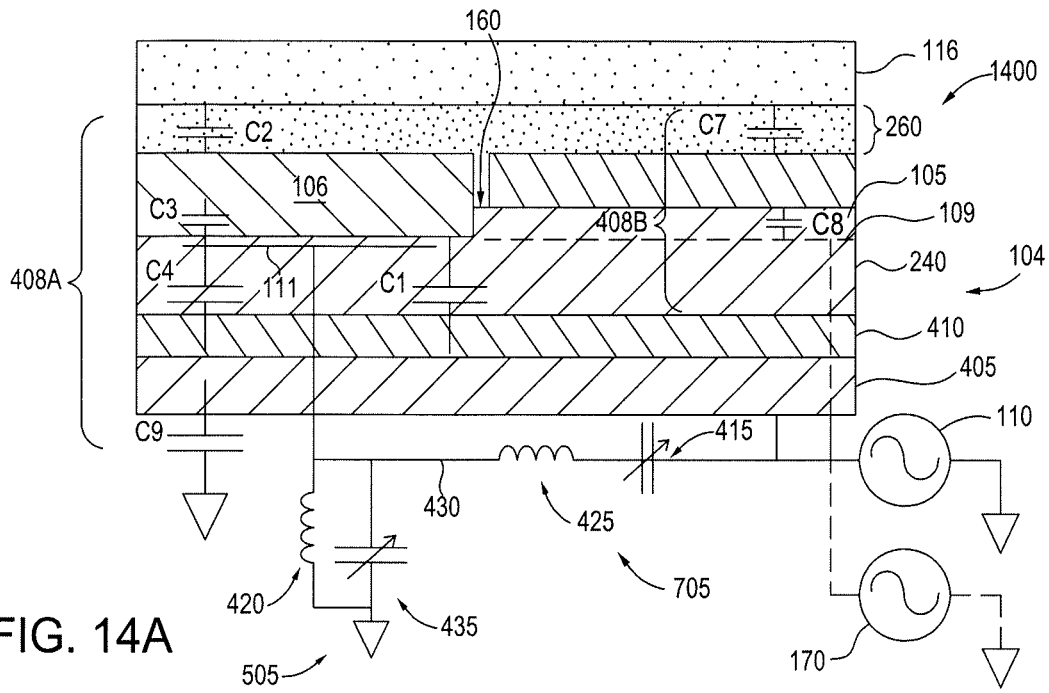
FIGS. 14A and 14B illustrate schematic circuit diagrams illustrating one embodiment of an RF circuit.
Figure 14B:
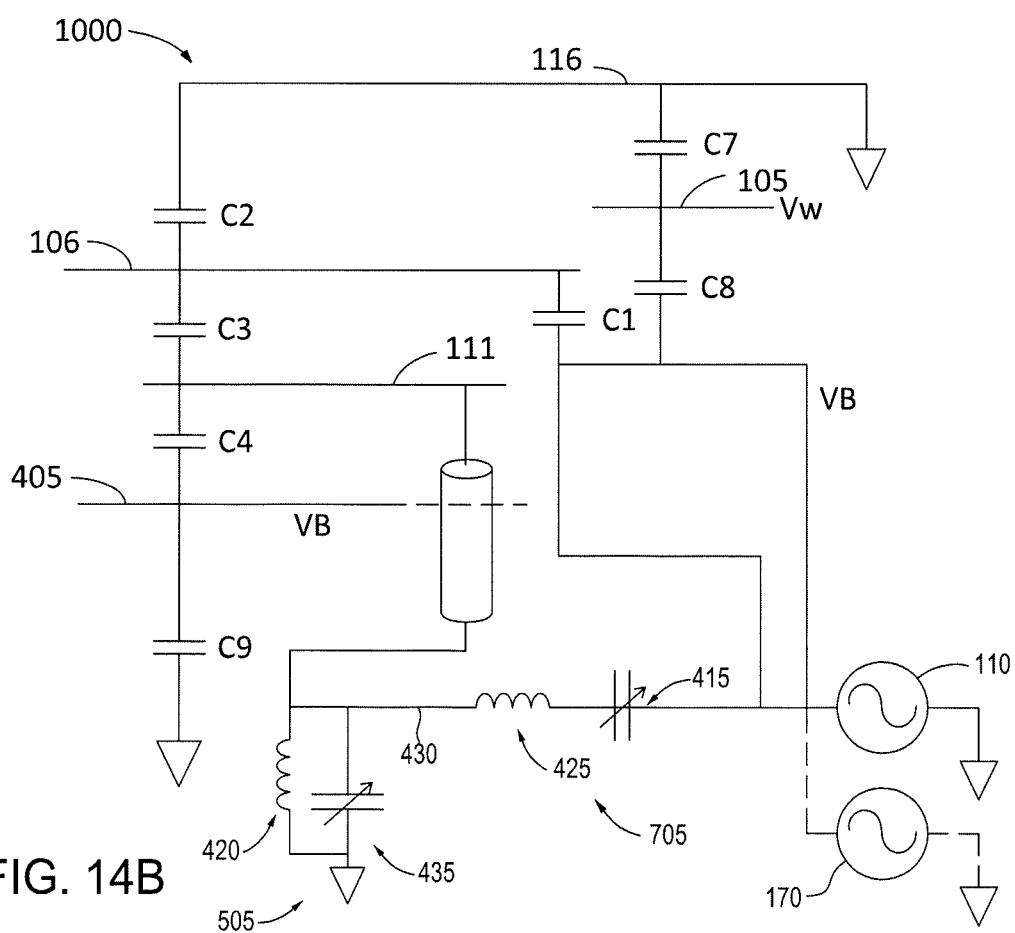

FIGS. 14A and 14B are schematic circuit diagrams illustrating another embodiment of a RF circuit 1400. The RF circuit 1400 may be a portion of the tuning circuit 155 shown in FIG. 1. To facilitate explanation, FIG. 14B illustrates the RF circuit 1400 overlaid on a partial view of the substrate support assembly 104. The RF circuit 1400 describes the functional relationships among components of a system.

The RF circuit 1400 is similar to the RF circuits 1100, 1200 and/or 1300 with the following exceptions. A series LC circuit 705 is provided between the baseplate 405 and the edge ring electrode 111. The series LC circuit 705 comprises the second inductor 425 and the first variable capacitor 415 coupled to the signal line 430. Additionally, the first parallel LC circuit 505 is provided between ground potential and the edge ring electrode 111. The series resonant circuit 705 can provide a low impedance to the RF power source 110, while the parallel resonant circuit 505 can provide a high impedance to ground.

FIGS. 15A and 15B are schematic circuit diagrams illustrating another embodiment of a RF circuit 1000. The RF circuit 1500 may be a portion of the tuning circuit 155 shown in FIG. 1. To facilitate explanation, FIG. 15B illustrates the RF circuit 1500 overlaid on a partial view of the substrate support assembly 104. The RF circuit 1500 describes the functional relationships among components of a system.

The RF circuit 1500 is similar to the RF circuits 1100, 1200, 1300 and/or 1400 with the following exceptions. The series LC circuit 605 comprises a first LC circuit that is combined with the series LC circuit 705 as a second series LC circuit 605. Both of the series LC circuit 605 and the series LC circuit 705 are described in FIGS. 13A-14B. The first series resonant circuit 705 can provide a low impedance to the RF power source 110, while the second series resonant circuit 605 can provide a high impedance to ground.

When the power is applied to the ring electrode 111, RF voltage and current develop at the edge ring 106 as a result of coupling. The two inductors 420 and 425 have fixed values. Tuning the two variable capacitors 415 and 435 in different range of values enables tuning of high and low voltages at the ring electrode 111 at two different frequencies (e.g., 13.56 MHz and 2 MHz). For example, varying capacitance at the first variable capacitor 415 and/or the second variable capacitor 435 enables voltage adjustment at the ring electrode 111 in either of the two frequencies provided to the ring electrode 111 from the RF power source 110 and/or the second RF power source 170. For example, the voltage applied to the ring electrode 111 can be varied from zero to two times the voltage applied to the first electrode 109 at either of the two frequencies provided by the RF power source 110 and/or the second RF power source 170.

In some embodiments, voltages, currents, and their phases can be measured at the ring electrode 111 and the baseplate 405. Using the measured voltages, currents, and their phases at these points, the system controller 108 (FIG. 1) monitors a voltage ratio of edge ring 106 and the substrate 105, and a phase difference between the voltages of the edge ring 106 and the substrate 105. Additionally or alternatively, the system controller 108 monitors the ratio of current amplitude and phase difference between the edge ring 106 and the substrate 105.

Based on the monitoring results, one or a combination of the first variable capacitor 415 and the second variable capacitor 435 can be adjusted to manipulate voltage or current applied to the ring electrode 111, which affects the voltage or current developed at the edge ring 106. Consequently, the height of the plasma sheath 260 above the edge ring 106 can be controlled.

Figure 16:
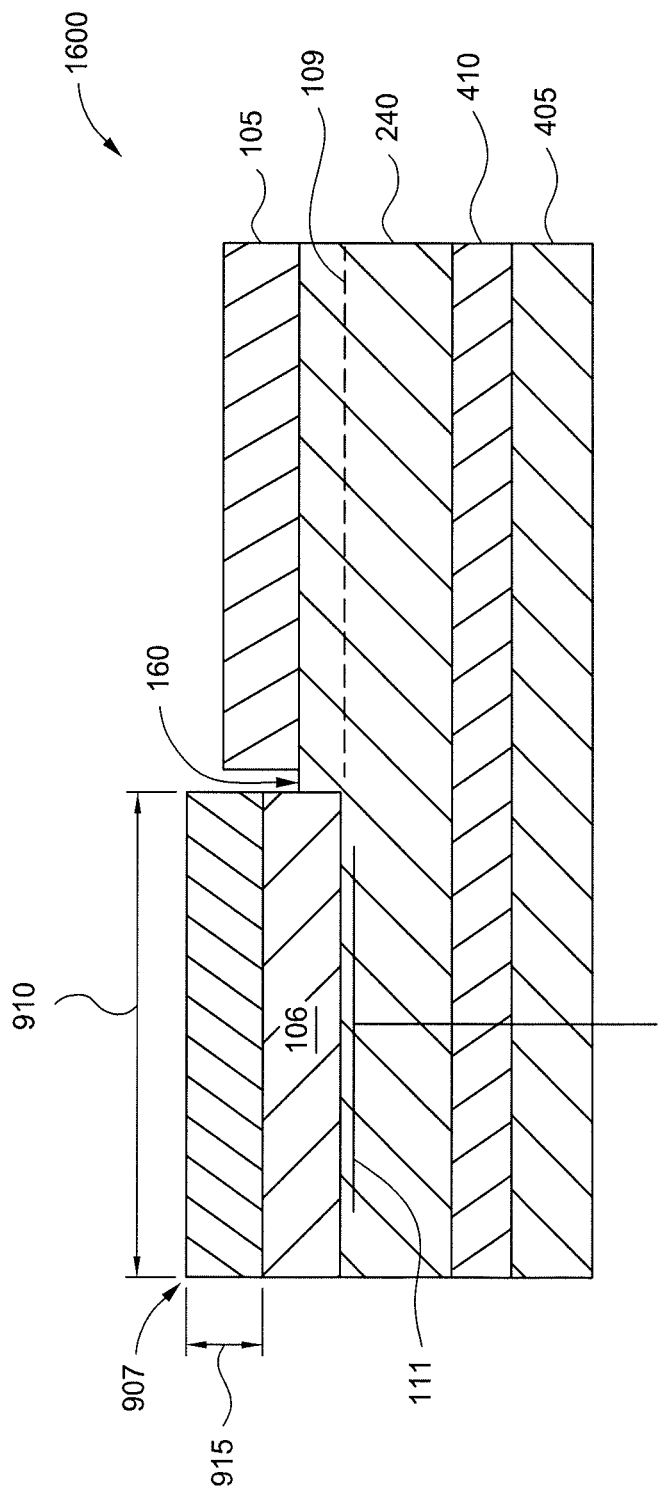
FIG. 16 is a schematic side view illustrating a portion of a substrate support assembly having a quartz cover ring disposed on the edge ring.

FIG. 16 is a schematic side view illustrating a portion of a substrate support assembly 1600 having a quartz cover ring 907 disposed on the edge ring 106. The substrate support assembly 1600 and the quartz cover ring 907 may be utilized as the substrate support assembly 104 of FIGS. 1-2B.

The quartz cover ring 907 may be utilized when particle generation is an issue. For example, in logic circuit applications, where particles must be kept at a minimum, the quartz cover ring 907 may be used to prevent etching of the edge ring 106 which may produce particles. The quartz cover ring 907 has a width dimension 910 that is substantially equal to a width dimension of the edge ring 106. The quartz cover ring 907 has a thickness 915 that is about 0.03 inches to about 0.09 inches, for example, about 0.06 inches.

Testing of the substrate support assembly 104 having the various RF circuits 400-1500 shows enhanced plasma control at the edge of a substrate. Further, feature tilting control is enhanced. For example, tests with a 300 mm substrate indicate that low voltages and high voltages applied to the edge ring electrode 111 below the edge ring 106 has been shown to produce a range of greater than about 7 degrees at a radius 146 mm, or greater. Additionally, testing of a substrate support assembly 104 with the quartz cover ring 907 yielded results similar to tests of the substrate support assembly 104 without the quartz cover ring 907. Thus, utilizing the quartz cover ring 907 provides plasma sheath control as well as reducing particle generation.

Figure 17:
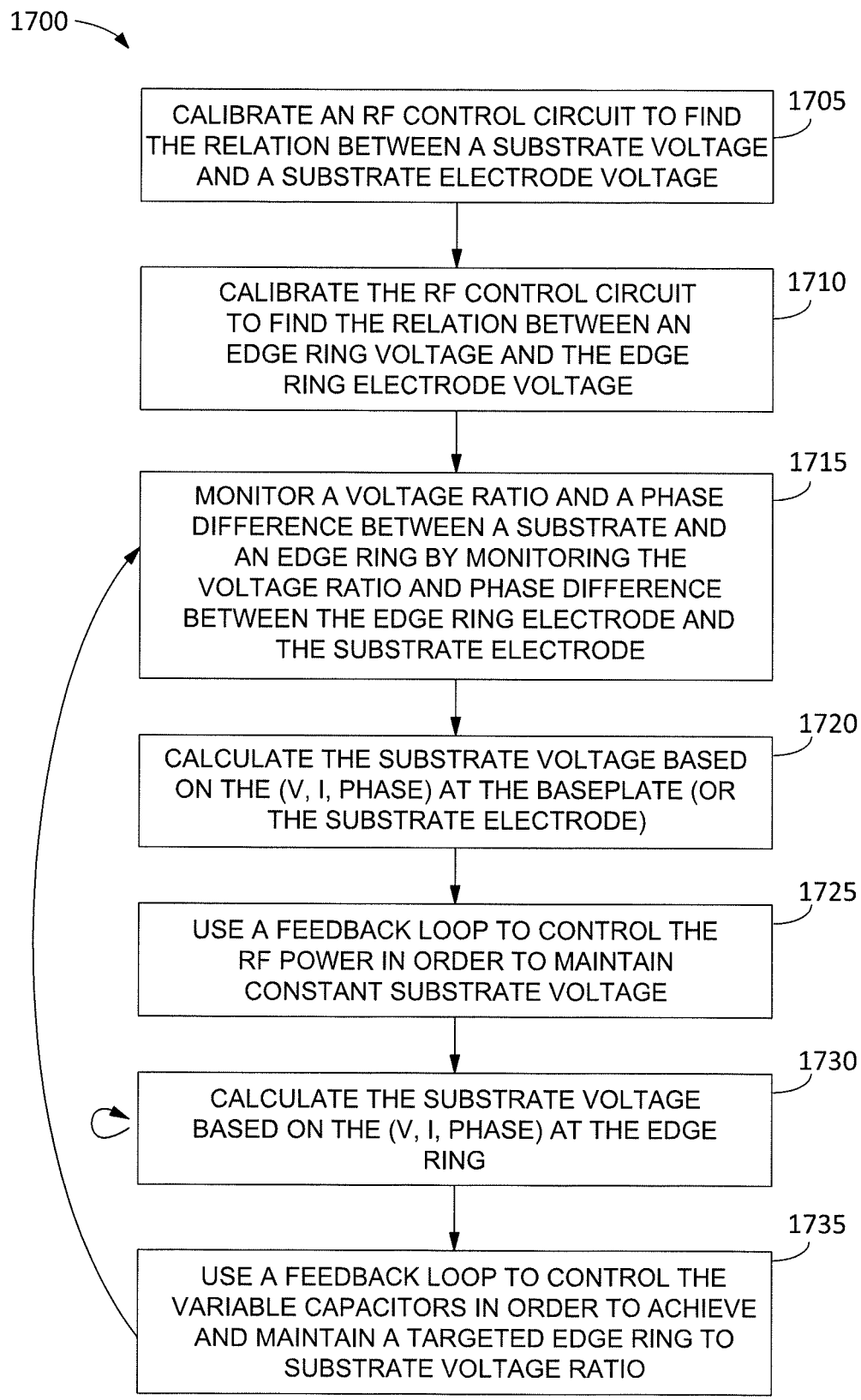
FIG. 17 is a flow diagram illustrating an operation process for the RF circuits according to one aspect of the disclosure.

FIG. 17 is a flow diagram illustrating an operation process 1700 for the RF circuits described above according to one aspect of the disclosure. This operation process can apply generally to the RF circuit configurations of FIGS. 4A-15B provided in this disclosure.

In operation 1705, the controller 108 calibrates an RF circuit to find the relation between the voltages of the substrate 105 and the substrate electrode 109 (or the baseplate 405).

In operation 1710, the controller 108 calibrates the RF circuit to find the relation between the voltages of the edge ring 106 and the edge ring electrode 111.

In operation 1715, voltages, currents, and their phases are measured at the edge ring electrode, the substrate electrode 109 (or baseplate), and a point between the inductor and the capacitor, respectively. Based on the measured results, the controller 108 monitors an amplitude ratio and phase difference between the voltages of the edge ring 106 and the substrate 105 by monitoring a voltage ratio and phase difference between the voltages of edge ring electrode 111 and substrate electrode 109 (or, in some embodiments, the baseplate 405).

In operation 1720, the controller 108 calculates the voltage of the substrate 105 based on the (V, I, phase) at the baseplate 405 (or the substrate electrode 109).

In operation 1725, the controller 108 operates a feedback loop to adjust the RF power source 110 such that the substrate electrode 109 (or baseplate 405) maintains constant the amplitude of voltage at the substrate at a certain level so that the plasma parameters at the center of the substrate 105 keeps constant while the parameters at the extreme edge is changed by adjusting the variable capacitor C5 and/or C6.

In operation 1730, the controller 108 calculates the voltage of the edge ring 106 based on the (V, I, phase) at the edge ring electrode 111.

In operation 1735, the controller 108 operates a feedback loop to tune the variable capacitor C5 and/or C6 to obtain a target amplitude of the voltage at the edge ring 106 as necessary to maintain a targeted edge ring to substrate voltage ratio in order to compensate for any erosion of the edge ring 106 or adjust the process profile on substrate edge.

Subsequently, the controller proceeds to operation 1715 to monitor a voltage ratio and a phase difference between the voltages of the edge ring 106 and the substrate while substrates continue to be processed.

Figure 18:
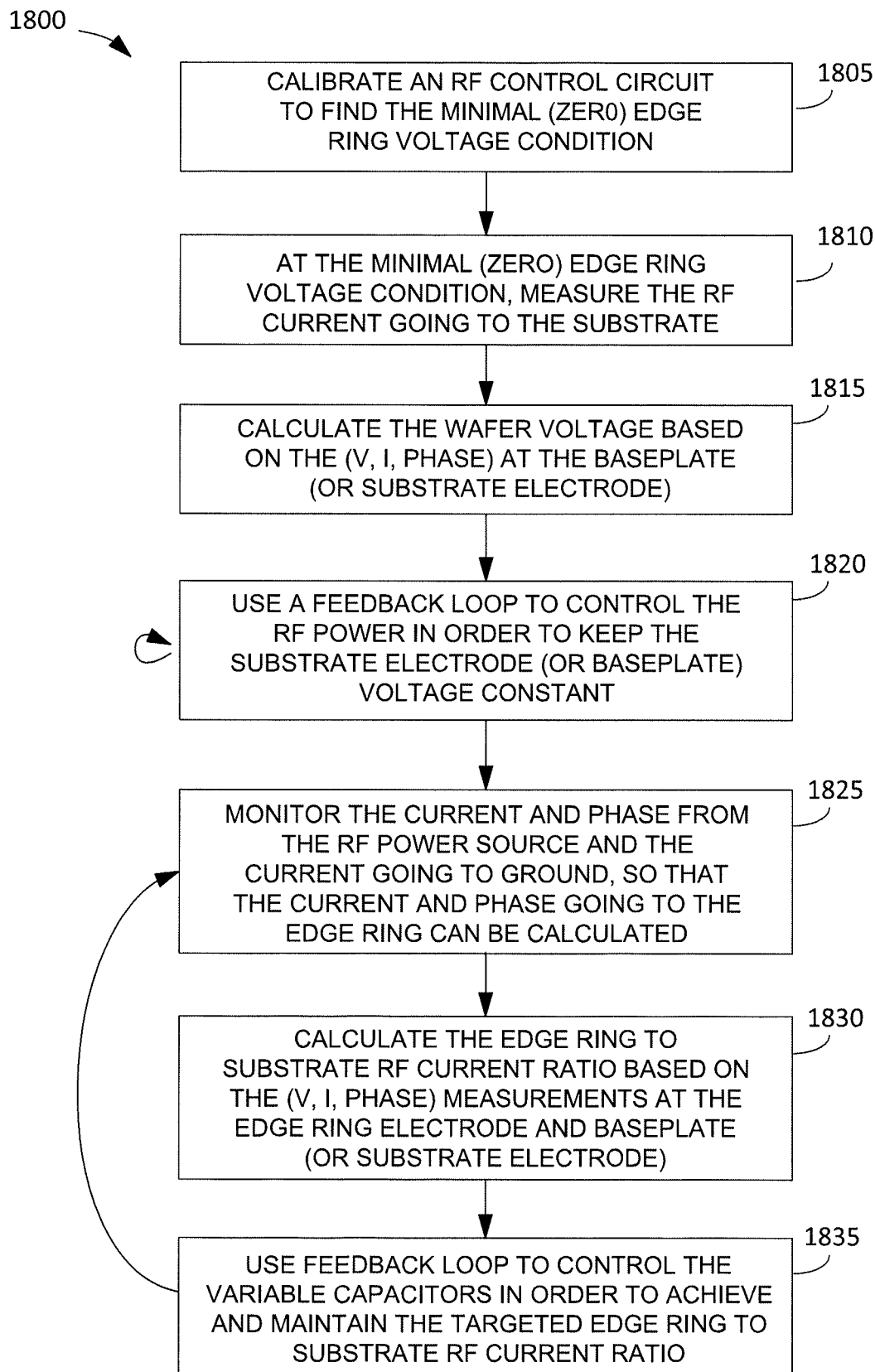
FIG. 18 is a flow diagram illustrating an operation process for the RF circuits according to another aspect of the disclosure.

FIG. 18 is a flow diagram illustrating an operation process 1800 for the RF circuits according to another aspect of the disclosure. This operation process can apply generally to the RF circuit configurations of FIGS. 4A-15B provided in this disclosure.

In operation 1805, the controller 108 calibrates an RF circuit to find a condition for a minimal or zero voltage at the edge ring 106.

In operation 1810, under the conditions for a minimal or zero voltage at the edge ring, the controller 108 measures an RF current going to the substrate 105.

In operation 1815, the controller 108 calculates the voltage of the substrate 105 based on the (V, I, phase) at the baseplate 405 (or the substrate electrode 109).

In operation 1820, the controller 108 operates a feedback loop to adjust the RF power source 110 to maintain the substrate electrode 109 (or baseplate 405) at a certain amplitude of voltage so that the plasma parameters at the center of the substrate keeps constant.

In operation 1825, voltages, currents, and their phases are measured at the edge ring electrode 111, the substrate electrode 109 (or baseplate 405), and a point between the inductor and the capacitor, respectively. Based on the measured results, the controller 108 monitors amplitudes and phases of the total current generated from the RF power source 110 and the current going to the ground, so that the amplitude and phase of the current going to the edge ring electrode 111 can be calculated, e.g., by subtracting the current going to the ground from the total current.

In operation 1830, the controller 108 calculates the edge ring to substrate RF current ratio based on the (V, I, phase) measurements at the edge ring electrode 111 and baseplate 405 (or substrate electrode 109).

In operation 1835, the controller 108 operates a feedback loop to tune the variable capacitor C5 and/or C6 to obtain a target amplitude and phase of the current at the edge ring 106 as needed in order to achieve and maintain the targeted edge ring to substrate RF current ratio in order to compensate for any erosion of the edge ring 106 or adjust the process profile on substrate edge.

Subsequently, the controller 108 proceeds to operation 1830 to monitor an amplitude and phase of current generated from the RF power source 110 and current going to the ground while substrates continue to be processed.

For processes with two different frequencies of RF bias input 110, the user can choose to tune the edge ring RF voltage and current at either frequency (e.g. 2 or 13 MHz), then different ranges of the variable capacitance C5 can be used for the tuning with the assistance of the feedback control loop 1700 or 1800.

FIGS. 19A to 19D depict example simulation results of the amplitude ratio and the phase difference between the edge ring electrode 111 and the substrate electrode 109 when employing each of the RF circuits disclosed in the disclosure.

Figure 19A:
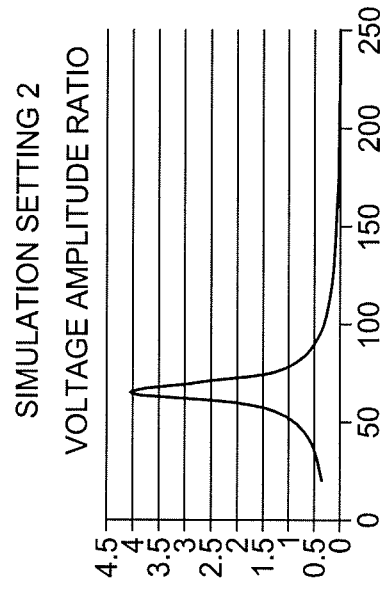
FIGS. 19A to 19D show simulation results of the amplitude ratio and the phase difference between the edge ring electrode and the substrate electrode according to one aspect of the disclosure.

FIG. 19A shows that the embodiments provided in this disclosure allow for manipulating the voltage ratio between the edge ring electrode 111 and the substrate electrode 109 from 0.2 to 3.2 by adjusting a variable capacitance, e.g., C5 from 20 pF to 250 pF. Also, as shown in FIG. 19B the embodiments provided in this disclosure are able to manipulate the phase difference between the edge ring electrode and the substrate electrode 109 from 0 to 110 degrees by adjusting a variable capacitance, e.g., C5 from 20 pF to 250 pF. The simulation result of FIGS. 19A and 19B can be generated when employing the RF circuits of, for example, FIGS. 6A and 6B or FIGS. 7A and 7B.

Figure 19C:
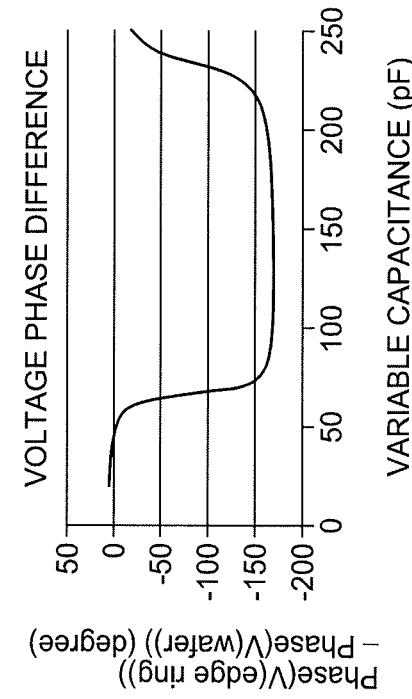
Figure 19B:
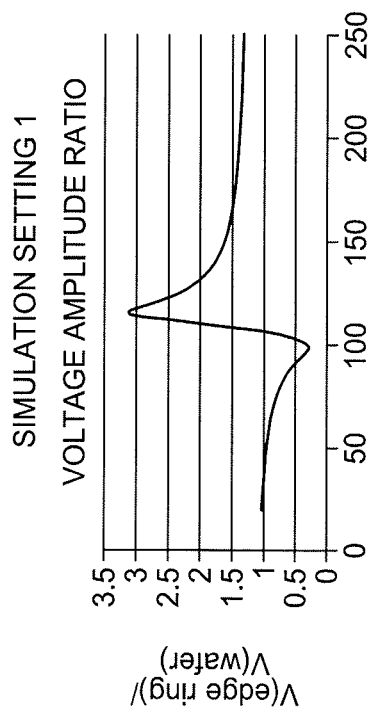
Figure 19D:
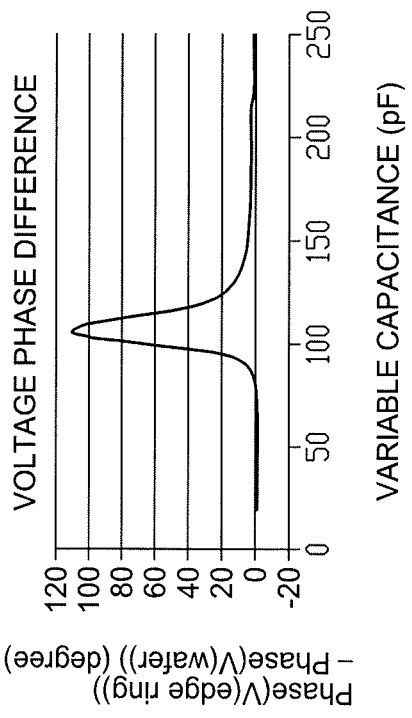

FIG. 19C shows that the embodiments in this disclosure allow for manipulating the voltage ratio between the edge ring electrode 111 and the substrate electrode 109 from 0.4 to 4.1 by adjusting a variable capacitance, e.g., C5 from 20 pF to 250 pF. Also, FIG. 19D shows that the embodiments can manipulate the phase difference between the edge ring electrode 111 and the substrate electrode 109 from 0 to −170 degrees by adjusting a variable capacitance, e.g., C5 from 20 pF to 250 pF. The simulation result of FIGS. 19A and 19B can be generated when employing the RF circuits of, for example, FIGS. 8A and 8B.

As shown in the above simulation results, the RF circuits described in this disclosure are able to manipulate the amplitude and phase of the voltage or current of the edge ring 106 relative to those of the substrate 105 across a wide range, which allows for maintaining the height of the plasma sheath above the edge ring 106 to a certain level as desired.

Benefits of the disclosure include the ability to adjust plasma sheaths at the substrate edge in lieu of replacing chamber components, thereby improving device yield while mitigating downtime and reducing expenditures on consumables. Additionally, aspects described herein allow for the plasma sheath to be adjusted at the substrate edge without affecting the plasma parameters at substrate center, thereby providing a tuning knob for extreme edge process profile control and feature tilting correction.

What is claimed is:

1. A substrate support, comprising:
a vertical stack comprising:
an electrostatic chuck having a substrate electrode embedded therein for chucking a substrate to an upper surface of the electrostatic chuck, wherein the electrostatic chuck includes one or more channels through which a fluid is provided to facilitate temperature control of the substrate support,
a ground plate surrounding an insulating layer, wherein the insulating layer is below the electrostatic chuck,
a baseplate underneath the electrostatic chuck to feed power to the substrate, the baseplate positioned between a lower portion of the ground plate and the electrostatic chuck,
a quartz pipe ring circumscribing the baseplate and the electrostatic chuck;
an edge ring disposed over the electrostatic chuck and circumscribes the substrate;
an edge ring electrode located underneath the edge ring; and
a tuning circuit configured to couple a first pulsed DC power source to the substrate electrode and to the edge ring electrode through transmission lines spaced about the substrate support at evenly spaced intervals, the tuning circuit comprising:
a first circuit coupled to the edge ring electrode through one of the transmission lines, the first circuit comprises:
a first variable capacitor coupled to the edge ring electrode.

2. The substrate support of claim 1, wherein the:
the first circuit is further coupled to the substrate electrode.

3. The substrate support of claim 2, wherein the first circuit further includes a second variable capacitor that is coupled to the ground and to a point between the edge ring electrode and the first variable capacitor.

4. The substrate support of claim 2, the first circuit additionally includes a first fixed capacitor wherein a first range of values of the combination of the first variable capacitor increase/decrease amplitude of voltage at the edge ring.

5. The substrate support of claim 2, wherein the first variable capacitor and the second variable capacitor are connected in parallel.

6. The substrate support of claim 2, wherein the circuit is coupled to a second pulsed DC power source.

7. The substrate support of claim 6, wherein the second pulsed DC power source is connected to the edge ring electrode.

8. A process chamber comprising:
a chamber body;
a lid disposed on the chamber body;
an inductively coupled plasma apparatus positioned above the lid; and
a substrate support positioned within the chamber body, the substrate support comprising:
a vertical stack comprising:
an electrostatic chuck having a substrate electrode embedded therein for chucking a substrate to an upper surface of the electrostatic chuck, wherein the electrostatic chuck includes one or more channels through which a fluid is provided to facilitate temperature control of the substrate support,
a ground plate surrounding an insulating layer, wherein the insulating layer is below the electrostatic chuck, a baseplate underneath the electrostatic chuck to feed power to the substrate, the baseplate positioned between a lower portion of the ground plate and the electrostatic chuck, a quartz pipe ring circumscribing the baseplate and the electrostatic chuck;

an edge ring disposed over the electrostatic chuck and circumscribes the substrate;

an edge ring electrode located about a periphery of the baseplate, wherein the edge ring electrode is located underneath the edge ring; and a tuning circuit configured to couple a first pulsed DC power source to the substrate electrode and to the edge ring electrode through transmission lines spaced about the substrate support at evenly spaced intervals, the tuning circuit comprising:

a first circuit coupled to the edge ring electrode through the collection of transmission lines by attachment to the feed transmission line before it is split, the first circuit comprises:

a first variable capacitor coupled to the edge ring electrode.

9. The process chamber of claim 8, further comprising:

a controller configured to adjust the first variable capacitor to manipulate either voltage or current at the edge ring through the edge ring electrode, wherein the first variable capacitor is coupled to one of the first pulsed DC power source.

10. The process chamber of claim 9, wherein the circuit further includes a second variable capacitor that is coupled to ground and to a point between the edge ring electrode and the first variable capacitor.

11. The substrate support of claim 9, wherein a first range of values of the combination of the first variable capacitor and the second variable capacitor increase/decrease amplitude of voltage at the edge ring, and wherein a second range of the combination of the first variable capacitor and the second variable capacitor increase/decrease the amplitude of the voltage at the edge ring.

12. The substrate support of claim 9, wherein the circuit is coupled to a second pulsed DC power source.

13. The process chamber of claim 12, wherein the second pulsed DC power source is connected to the edge ring through a variable capacitor and an inductor.

* * * * *